US012652905B2

(12) United States Patent
Kim et al.

(10) Patent No.: US 12,652,905 B2
(45) Date of Patent: Jun. 9, 2026

(54) DISPLAY DEVICE

(71) Applicant: Samsung Display Co., Ltd., Yongin-si (KR)

(72) Inventors: Jae Ik Kim, Yongin-si (KR); Hye Jin Gwark, Yongin-si (KR); Hwi Kim, Yongin-si (KR); Jung Sun Park, Yongin-si (KR); Yeon Hwa Lee, Yongin-si (KR); Joon Gu Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 337 days.

(21) Appl. No.: 18/244,535

(22) Filed: Sep. 11, 2023

(65) Prior Publication Data

US 2024/0179955 A1      May 30, 2024

(30) Foreign Application Priority Data

Nov. 25, 2022      (KR) ........................ 10-2022-0160646

(51) Int. Cl.
| | |
|---|---|
| *H10K 59/122* | (2023.01) |
| *H10K 50/15* | (2023.01) |
| *H10K 50/16* | (2023.01) |
| *H10K 50/17* | (2023.01) |

(52) U.S. Cl.
CPC ........... *H10K 59/122* (2023.02); *H10K 50/15* (2023.02); *H10K 50/16* (2023.02); *H10K 50/171* (2023.02)

(58) Field of Classification Search
CPC .... H10K 59/122; H10K 50/16; H10K 50/171; H10K 50/15

USPC ........................................................ 257/40
See application file for complete search history.

(56) References Cited

U.S. PATENT DOCUMENTS

| | | |
|---|---|---|
| 9,502,480 B2 | 11/2016 | Kim |
| 9,780,148 B2 | 10/2017 | Pyo et al. |
| 10,283,570 B2 | 5/2019 | Pyo et al. |
| 10,665,639 B2 | 5/2020 | Pyo et al. |

(Continued)

FOREIGN PATENT DOCUMENTS

| | | |
|---|---|---|
| KR | 20160022989 A | 3/2016 |
| KR | 20160103570 A | 9/2016 |

(Continued)

*Primary Examiner* — Tu-Tu V Ho
(74) *Attorney, Agent, or Firm* — CANTOR COLBURN LLP

(57) ABSTRACT

A display device includes a pixel electrode, a pixel defining layer disposed on the pixel electrode and forming an opening which exposes a portion of the pixel electrode, an auxiliary electrode disposed on the pixel defining layer and the pixel electrode, an intermediate layer disposed on the pixel defining layer and the auxiliary electrode and a common electrode disposed on the intermediate layer. The pixel defining layer includes a recessed portion recessed into the pixel defining layer, the auxiliary electrode includes a first undercut forming portion disposed on the recessed portion and contacting the portion of the pixel electrode, and the intermediate layer includes a hole injection layer, a light-emitting layer and an electron injection layer stacked sequentially. The hole injection layer includes a first portion disposed on the first undercut forming portion and a second portion separated from the first portion and disposed on the recessed portion.

20 Claims, 19 Drawing Sheets

PDL: PDLa, PDLb
PDLb: PDLb1, PDLb2
UDE1: UDE1a, UDE1b
HIL: HILa, HILb

(56)                    References Cited

U.S. PATENT DOCUMENTS

| | | |
|---|---|---|
| 11,056,542 B2 | 7/2021 | Pyo et al. |
| 11,056,547 B2 * | 7/2021 | Lee ...................... H10K 71/221 |
| 11,626,574 B2 | 4/2023 | Kim et al. |
| 11,683,947 B2 | 6/2023 | Kwon et al. |
| 12,356,846 B2 | 7/2025 | Jeong et al. |
| 2023/0247854 A1 | 8/2023 | Kim et al. |
| 2025/0287789 A1 | 9/2025 | Kim et al. |

FOREIGN PATENT DOCUMENTS

| | | |
|---|---|---|
| KR | 101821167 B1 | 1/2018 |
| KR | 20180066556 A | 6/2018 |
| KR | 102011952 B1 | 8/2019 |
| KR | 20200075192 A | 6/2020 |
| KR | 20200121427 A | 10/2020 |
| KR | 20220037537 A | 3/2022 |

* cited by examiner

PDL: PDLa, PDLb
PDLb: PDLb1, PDLb2
UDE1: UDE1a, UDE1b
HIL: HILa, HILb

PDLa

PDLb'

PDLa

PDLb'

PXE

VIA

PDL': PDLa', PDLb'

DR3

DR2

DR1

PDL': PDLa', PDLb'
UDE1: UDE1a, UDE1b

PDL: PDLa, PDLb
PDLb: PDLb1, PDLb2
UDE1: UDE1a, UDE1b

PDL: PDLa, PDLb
PDLb: PDLb1, PDLb2
UDE1: UDE1a, UDE1b

PDL: PDLa, PDLb
PDLb: PDLb1, PDLb2
UDE1: UDE1a, UDE1b
HIL: HILa, HILb

FIG.12

ML_2: HIL_2, HTL, EML, ETL, EIL
HIL_2: HILa_2, HILb_2, HILc_2
PDL_2: PDLa, PDLb_2
UDE1_2: UDE1_2a, UDE1_2b

PDL_2: PDLa, PDLb_2
UDE1_2: UDE1_2a, UDE1_2b
UDE1_2b: UDE1_2ba, UDE1_2bb
HIL_2: HILa_2, HILb_2, HILc_2

PDLa

PDLb_2'

PDLa

PDLb_2'

PXE

VIA

PDL_2' : PDLa, PDLb_2'

DR3

DR2

DR1

PDL_2' : PDLa, PDLb_2'
UDE1_2 : UDE1_2a, UDE1_2b
UDE1_2b : UDE1_2ba, UDE1_2bb

DISPLAY DEVICE

This application claims priority to Korean Patent Application No. 10-2022-0160646, filed on Nov. 25, 2022, and all of the benefits accruing therefrom under 35 U.S.C. § 119, the contents of which is incorporated herein by reference in its entirety.

BACKGROUND

1. Field

The disclosure relates to a display device and a method of manufacturing the same.

2. Description of the Related Art

Display devices are becoming increasingly important with the development of multimedia. Accordingly, various types of display devices, such as organic light emitting displays and liquid crystal displays are being used.

An organic light emitting display includes two electrodes and an organic light emitting layer located between the two electrodes. Electrons injected from one electrode and holes injected from the other electrode combine together in the organic light emitting layer to form excitons, and the excitons emit light as they release energy.

The organic light emitting display includes a plurality of pixels, each including an organic light emitting diode which is a self-light emitting element. In each pixel, a plurality of thin-film transistors and one or more capacitors for driving the organic light emitting diode are formed. The thin-film transistors generate a driving current, but the problem is that they may also generate a leakage current which affects the driving of an adjacent pixel.

SUMMARY

Embodiments of the disclosure provide a display device which can reduce the generation of a leakage current that affects driving of an adjacent pixel.

embodiments of the disclosure also provide a method of manufacturing a display device in which the generation of a leakage current that affects driving of an adjacent pixel is reduced.

However, embodiments of the disclosure are not limited to those set forth herein. The above and other features of embodiments of the disclosure will become more apparent to one of ordinary skill in the art to which the disclosure pertains by referencing the detailed description of the disclosure given below.

According to an embodiment of the disclosure, a display device includes a pixel electrode disposed on a substrate, a pixel defining layer disposed on the pixel electrode and including an inclined surface which forms an opening exposing a portion of the pixel electrode, a first auxiliary electrode disposed on the pixel defining layer and the pixel electrode, an intermediate layer disposed on the pixel defining layer and the first auxiliary electrode, and a common electrode disposed on the intermediate layer, wherein the first auxiliary electrode includes a first flat portion in contact with the portion of the pixel electrode exposed by the opening of the pixel defining layer and a first inclined portion in contact with at least a portion of the inclined surface of the pixel defining layer, wherein the inclined surface of the pixel defining layer includes a first area spaced apart from the first inclined portion of the first auxiliary electrode and a second area protruding from the first area toward the opening and contacting at least a portion of the first inclined portion of the first auxiliary electrode, wherein the intermediate layer includes a hole injection layer, a light-emitting layer and an electron injection layer stacked sequentially, wherein the first inclined portion of the first auxiliary electrode protrudes from the second area of the pixel defining layer and is spaced apart from the first area of the pixel defining layer to form a space therebetween, and wherein the hole injection layer of the intermediate layer includes a first portion disposed on the first area of the inclined surface of the pixel defining layer and a second portion separated from the first portion and disposed on the first auxiliary electrode.

In an embodiment, the intermediate layer further includes a hole transport layer disposed between the light-emitting layer and the hole injection layer, wherein the hole transport layer integrally extends to cover the inclined surface of the pixel defining layer and the first auxiliary electrode.

In an embodiment, the intermediate layer further includes an electron transport layer disposed between the light-emitting layer and the electron injection layer, wherein each of the electron transport layer and the electron injection layer integrally extends to cover the inclined surface of the pixel defining layer and the first auxiliary electrode.

In an embodiment, the first portion of the hole injection layer is configured such that the first portion of the hole injection layer does not contact the pixel electrode.

In an embodiment, the hole injection layer includes NDP-9.

In an embodiment, the second area of the pixel defining layer is located further inward than the first inclined portion of the first auxiliary electrode to form an undercut shape.

In an embodiment, the second portion of the hole injection layer includes a profile corresponding to that of the first auxiliary electrode.

In an embodiment, the display device further includes a second auxiliary electrode disposed between the first auxiliary electrode and the intermediate layer, wherein the second auxiliary electrode includes a second flat portion disposed on the first flat portion of the first auxiliary electrode and a second inclined portion disposed on the first inclined portion of the first auxiliary electrode.

In an embodiment, the second inclined portion of the second auxiliary electrode protrudes from the first inclined portion of the first auxiliary electrode.

In an embodiment, the second portion of the hole injection layer is disposed on the second auxiliary electrode.

According to an embodiment of the disclosure, a display device includes a pixel electrode disposed on a substrate, a pixel defining layer disposed on the pixel electrode and forming an opening which exposes a portion of the pixel electrode, an auxiliary electrode disposed on the pixel defining layer and the pixel electrode, an intermediate layer disposed on the pixel defining layer and the auxiliary electrode, and a common electrode disposed on the intermediate layer, wherein the pixel defining layer includes a recessed portion recessed into the pixel defining layer, the auxiliary electrode including a first undercut forming portion disposed on a first side of the recessed portion and contacting the portion of the pixel electrode exposed by the opening of the pixel defining layer, and the intermediate layer including a hole injection layer, a light-emitting layer and an electron injection layer stacked sequentially together, wherein the hole injection layer of the intermediate layer includes a first portion disposed on the first undercut forming portion of the auxiliary electrode and a second portion separated from the first portion and disposed on the recessed portion of the pixel defining layer.

In an embodiment, the intermediate layer further includes a hole transport layer disposed between the light-emitting layer and the hole injection layer, wherein the hole transport layer integrally extends to cover an inclined surface of the pixel defining layer and the auxiliary electrode.

In an embodiment, the intermediate layer further includes an electron transport layer disposed between the light-emitting layer and the electron injection layer, wherein each of the electron transport layer and the electron injection layer integrally extends to cover the inclined surface of the pixel defining layer and the auxiliary electrode.

In an embodiment, the second portion of the hole injection layer is configured such that the second portion of the hole injection layer does not contact the auxiliary electrode.

In an embodiment, the hole injection layer includes NDP-9.

In an embodiment, the first undercut forming portion protrudes from the first side of the recessed portion to form an undercut shape wherein the first side of the recessed portion is located further inward than the first undercut forming portion.

In an embodiment, the auxiliary electrode further includes a second undercut forming portion disposed on a second side of the recessed portion, wherein the second undercut forming portion is disposed to be spaced apart from the first undercut forming portion.

In an embodiment, the second undercut forming portion protrudes from the second side of the recessed portion to form an undercut shape in which the second side of the recessed portion is located further inward than the second undercut forming portion.

In an embodiment, the first undercut forming portion and the second undercut forming portion are configured relative to each other such that a space is located between the first undercut forming portion and the second undercut forming portion to expose the recessed portion.

In an embodiment, the width of the space between the first undercut forming portion and the second undercut forming portion is smaller than the width of the recessed portion.

A display device according to an embodiment, may be configured to reduce the generation of a leakage current that affects driving of an adjacent pixel.

A method of manufacturing a display device according to an embodiment, wherein the display device may be configured to reduce the generation of a leakage current that affects driving of an adjacent pixel.

In an embodiment, a display device includes a pixel electrode disposed on a substrate, a pixel defining layer disposed on the pixel electrode and including an inclined surface which forms an opening exposing a portion of the pixel electrode, a first auxiliary electrode disposed on the pixel defining layer and the pixel electrode, an intermediate layer disposed on the pixel defining layer and the first auxiliary electrode and a common electrode disposed on the intermediate layer. The first auxiliary electrode includes a first flat portion in contact with the portion of the pixel electrode and a first inclined portion in contact with at least a portion of the inclined surface. The inclined surface includes a first area spaced apart from the first inclined portion and a second area protruding from the first area toward the opening and contacting at least a portion of the first inclined portion. The intermediate layer includes a hole injection layer, a light-emitting layer and an electron injection layer stacked sequentially. The first inclined portion protrudes from the second area and is spaced apart from the first area to form a space therebetween, and the hole injection layer includes a first portion disposed on the first area and a second portion separated from the first portion and disposed on the first auxiliary electrode.

In an embodiment, a display device includes a pixel electrode disposed on a substrate, a pixel defining layer disposed on the pixel electrode and forming an opening which exposes a portion of the pixel electrode, an auxiliary electrode disposed on the pixel defining layer and the pixel electrode, an intermediate layer disposed on the pixel defining layer and the auxiliary electrode and a common electrode disposed on the intermediate layer. The pixel defining layer includes a recessed portion recessed into the pixel defining layer. The auxiliary electrode includes a first undercut forming portion disposed on a first side of the recessed portion and contacting the portion of the pixel electrode, and the intermediate layer includes a hole injection layer, a light-emitting layer and an electron injection layer stacked sequentially. The hole injection layer includes a first portion disposed on the first undercut forming portion and a second portion separated from the first portion and disposed on the recessed portion.

BRIEF DESCRIPTION OF THE DRAWINGS

The above and other features of embodiments of the disclosure will become more apparent by describing in detail embodiments thereof with reference to the accompanying drawings, in which:

FIG. 12 is a cross-sectional view illustrating the schematic cross-sectional structure of a display device according to an embodiment;

DETAILED DESCRIPTION

Figure 1:
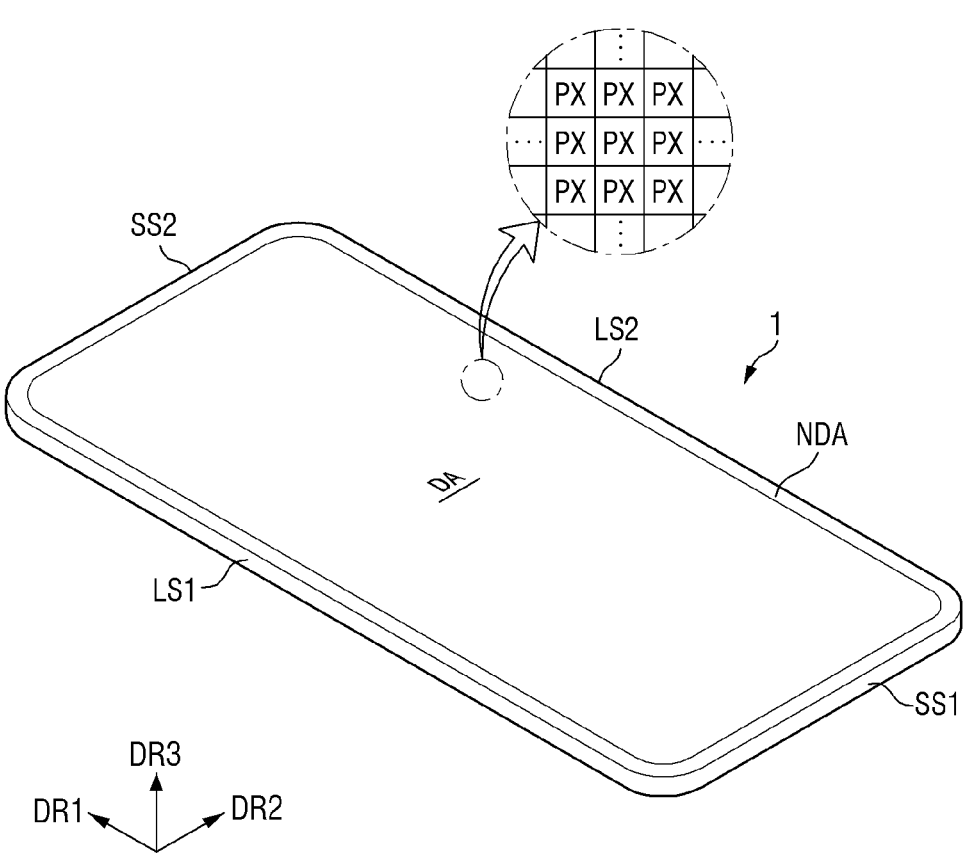
FIG. 1 is a perspective view of a display device according to an embodiment.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Each of the features of the various embodiments of the disclosure may be combined or combined with each other, in part or in whole, with departing from the scope of the invention. Each embodiment may be implemented independently of each other and/or may be implemented together in an association.

Hereinafter, embodiments will be described with reference to the accompanying drawings.

FIG. 1 is a perspective view of a display device 1 according to an embodiment.

In FIG. 1, a first direction DR1, a second direction DR2, and a third direction DR3 are defined and shown. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a horizontal direction in the drawing, the second direction DR2 refers to a vertical direction in the drawing, and the third direction DR3 refers to an up-down direction in the drawing, that is, a thickness direction. In the following specification, unless otherwise specified, a "direction" may refer to both directions extending to both sides along the direction. In addition, when it is necessary to distinguish both "directions" extending to both sides, a first side is referred to as a "first side in the direction," and a second side is referred to as a "second side in the direction." Based on FIG. 1, a direction in which an arrow is directed is referred to as the first side, and a direction opposite to the direction is referred to as the second side. However, directions mentioned in embodiments should be understood as relative directions, and the embodiments are not limited to the mentioned directions.

Hereinafter, for ease of description, in referring to surfaces of the display device 1 or each member constituting the display device 1, one surface facing the first side in a direction in which an image is displayed, that is, in the third direction DR3 is referred to as a top surface, and the other surface opposite the one surface is referred to as a bottom surface. However, the disclosure is not limited thereto, and the one surface and the other surface of each member may also be referred to as a front surface and a rear surface or as a first surface and a second surface, respectively. In addition, in describing relative positions of the members of the display device 1, the first side in the third direction DR3 may be referred to as an upper side, and the second side in the third direction DR3 may be referred to as a lower side.

The display device 1 may refer to any electronic device that provides a display screen. Examples of the display device 1 may include a mobile phone, a smartphone, a tablet personal computer (PC), an electronic watch, a smart watch, a watch phone, a mobile communication terminal, an electronic notebook, an electronic book, a portable multimedia player (PMP), a navigation device, a game machine, a digital camera, a television, a notebook computer, a netbook, a monitor, a billboard, and/or the Internet of things (IoT), all of which provide a display screen. An embodiment shows an example in which the display device 1 is applied to a medium-sized portable device such as a tablet PC.

The planar shape of the display device 1 is not limited. For example, in an embodiment the planar shape of the display device 1 may be modified to various shapes such as a rectangle, a square, a rhombus, other polygons, a circle, and/or an oval according to the field to which the display device 1 may be applied. The planar shape of the display device 1 may be a rectangle with rounded corners, and long sides LS1 and LS2 are located parallel to the first direction DR1. For ease of description, a long side located on one side (a left side in the plan view of FIG. 1) among two facing long sides of the rectangle will be referred to as a first long side LS1, and a long side located on the other side (a right side in the plan view of FIG. 1) will be referred to as a second long side LS2. In addition, a short side located on one side (a lower side in the plan view of FIG. 1) among two short sides facing each other will be referred to as a first short side SS1, and a short side located on the other side (an upper side in the plan view of FIG. 1) will be referred to as a second short side SS2. The terms "the first long side LS1," "the second long side LS2," "the first short side SS1," and "the second short side SS2" will be used to refer to corresponding sides of not only the display device 1 but also an element included in the display device 1 when the element has a shape and positional relationship similar to those of the display device 1.

The display device 1 may include a display area DA and a non-display area NDA. The display area DA is an area where a screen is displayed, and the non-display area NDA is an area where no screen is displayed. The terms "the display area DA" and "the non-display area NDA" may be used to refer to corresponding areas of not only the display device 1 but also an element included in the display device 1 when the element has a shape and positional relationship similar to those of the display device 1.

In an embodiment a plurality of pixels PX may be disposed in the display area DA. The structure of the pixels PX will be described later.

The non-display area NDA may be disposed around the display area DA. When the display area DA has a rectangular shape, the non-display area NDA may surround four sides of the display area DA. However, the present disclosure is not limited thereto. For example, in an embodiment the non-display area NDA may also be disposed outside some sides of the display area DA. In an embodiment, the non-display area NDA may exist inside the display area DA and may be surrounded by the display area DA.

Figure 2:
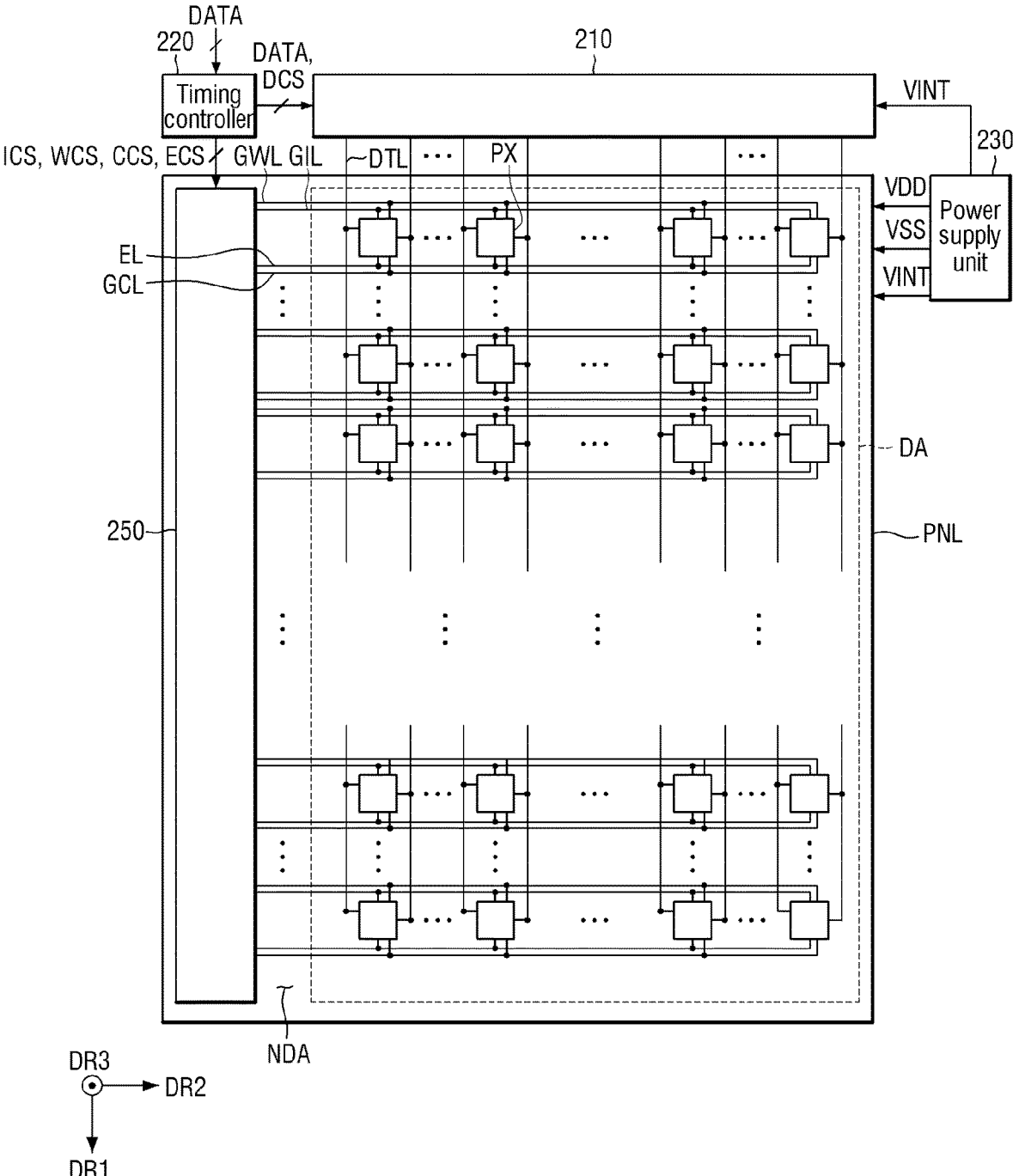
FIG. 2 is a schematic block diagram of the display device according to an embodiment.

FIG. 2 is a schematic block diagram of the display device 1 according to an embodiment.

Referring to FIG. 1 and FIG. 2, in an embodiment the display device 1 may include a display panel PNL. The display device 1 may further include a driving unit connected to the display panel PNL.

In the present specification, the term "connect" may mean that any one member and another member are connected to each other not only through physical contact but also through another member. In addition, it may be understood that any one part and another part may be connected to each other as one integrated member. Further, the connection between any one member and another member may be interpreted to include electrical connection through another member in addition to connection through direct contact.

In an embodiment the display panel PNL may provide a display screen. In the display device 1, a direction in which the display panel PNL provides the display screen is the first side in the third direction DR3. In an embodiment the display panel PNL may have a planar shape substantially similar to that of the display device 1. The display area DA of the display device 1 may also be referred to as the display area DA of the display panel PNL as described above. The display area DA of the display panel PNL may include a plurality of pixels PX arranged in a matrix shape.

Examples of the display panel PNL may include an organic light emitting display panel, a micro light emitting diode (LED) display panel, a nano LED display panel, a quantum dot light emitting display panel, a liquid crystal display panel, a plasma display panel, a field emission display panel, an electrophoretic display panel, and/or an electrowetting display panel. An embodiment where an organic light emitting display panel is applied as an example of the display panel PNL will be described below, but the disclosure is not limited to this embodiment, and other display panels may also be applied where the same technical spirit may be applicable.

The driving unit may drive the operation of the display panel PNL. At least some elements of the driving unit may drive the pixels PX that are disposed in the display area DA of the display panel PNL. In some embodiments, the driving unit may be provided in the form of a chip, film and/or circuit board.

In an embodiment, the driving unit may include a display scan driver 250, a data driver 210, a timing controller 220, and a power supply unit 230. Although the driving unit may be located in the non-display area NDA of the display panel PNL, some elements of the driving unit may also be disposed in the display area DPA.

In the display area DA, a plurality of wirings connected from the driving unit may also be disposed. The wirings may include a plurality of display write wirings GWL, a plurality of display initialization wirings GIL, a plurality of display control wirings GCL, a plurality of emission wirings EL, and/or a plurality of data wirings DTL.

In an embodiment, the data wirings DTL may extend in the first direction DR1. The display write wirings GWL, the display initialization wirings GIL, the display control wirings GCL, and the emission wirings EL may extend in the second direction DR2.

Each of the pixels PX may be connected to any one of the display write wirings GWL, any one of the display initialization wirings GIL, any one of the display control wirings GCL, and/or any one of the emission wirings EL. Each of the pixels PX may receive a data voltage of a data wiring DTL according to a display write signal of a display write wiring GWL, a display initialization signal of a display initialization wiring GIL, a display control signal of a display control wiring GCL and/or an emission signal of an emission wiring EL and may emit light by supplying a driving current to a light emitting element according to the data voltage.

The display scan driver 250 may be connected to the display write wirings GWL, the display initialization wirings GIL, the display control wirings GCL, and the emission wirings EL. The display scan driver 250 may include a display signal output unit which outputs display write signals transmitted to the display write wirings GWL, display initialization signals transmitted to the display initialization wirings GIL and/or display control signals transmitted to the display control wirings GCL and an emission signal output unit outputting emission signals transmitted to the emission wirings EL.

The display scan driver 250 may receive a write control signal WCS, an initialization control signal ICS, a scan control signal CCS, and/or an emission control signal ECS from the timing controller 220. The display signal output unit of the display scan driver 250 may generate display write signals according to the write control signal SCS and/or output the display write signals to the display write wirings GWL. In addition, the display signal output unit of the display scan driver 250 may generate display initialization signals according to the initialization control signal ICS and/or output the display initialization signals to the display initialization wirings GIL. In addition, the display signal output unit of the display scan driver 250 may generate display control signals according to the scan control signal CCS and/or output the display control signals to the display control wirings GCL. Furthermore, the emission signal output unit of the display scan driver 250 may generate display emission signals according to the emission control signal ECS and/or output the display emission signals to the display emission wirings EL.

The data driver 210 may convert digital video data DATA into data voltages and/or output the data voltages to the data wirings DTL. The data driver 210 may output the data voltages in synchronization with the display write signals. Pixels PX may be selected by the display write signals of the display scan driver 250, and the data voltages may be supplied to the selected pixels PX, respectively.

The timing controller 220 may receive the digital video data DATA and timing signals from an external graphics device. For example, in an embodiment the external graphics device may be, but is not limited to, a graphics card of a computer or a set-top box.

The timing controller 220 may generate the write control signal WCS, the initialization control signal ICS, the scan control signal CCS, and/or the emission control signal ECS for controlling the operation timing of the display scan driver 250 according to the timing signals. In addition, the timing controller 220 may generate a data control signal DCS for controlling the operation timing of the data driver 210 according to the timing signals.

The timing controller 220 may output the write control signal WCS, the initialization control signal ICS, the scan control signal CCS, and/or the emission control signal ECS to the display scan driver 250. The timing controller 220 may output the digital video data DATA and/or the data control signal DCS to the data driver 210.

The power supply unit 230 may generate a plurality of driving voltages and output the driving voltages to the display area DA. The power supply unit 230 may output a first driving voltage VDD, a second driving voltage VSS, and/or a third driving voltage VINT to the display panel PNL. The first driving voltage VDD may be a high potential driving voltage, the second driving voltage VSS may be a low potential driving voltage, and the third driving voltage VINT may be a voltage for initializing a gate electrode of a driving transistor of each pixel PX.

Figure 3:
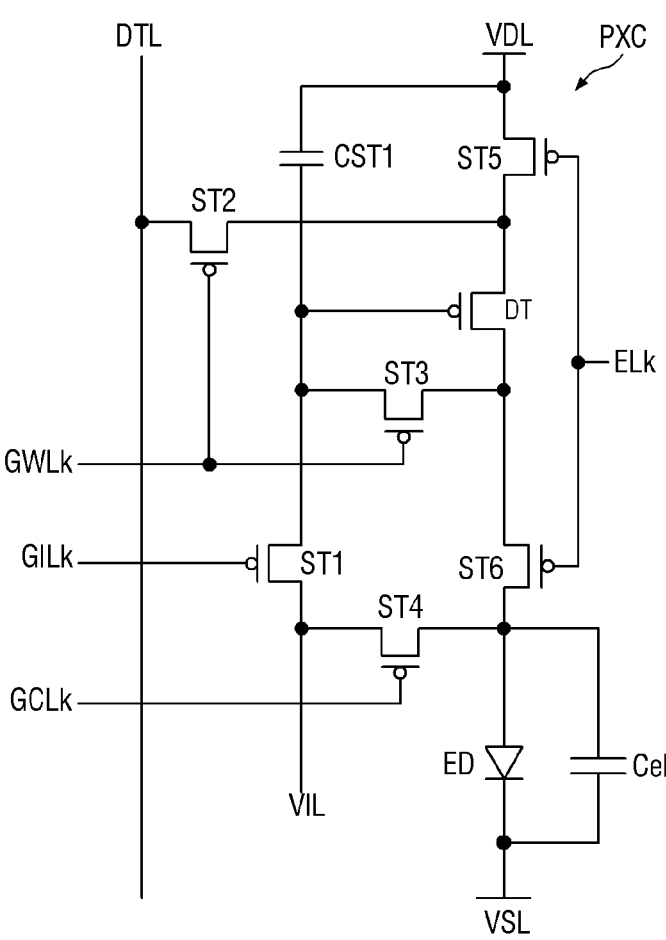
FIG. 3 is an equivalent circuit diagram of a pixel of the display device according to an embodiment.

FIG. 3 is an equivalent circuit diagram of a pixel PX of the display device 1 according to an embodiment.

Referring to FIG. 3, the pixel PX according to an embodiment may be connected to a $k^{th}$ (where k is a positive integer) display initialization wiring GILk, a $k^{th}$ display write wiring GWLk, and/or a $k^{th}$ display control wiring GCLk. In addition, the pixel PX may be connected to a first driving voltage wiring VDL to which the first driving voltage VDD is supplied, a second driving voltage wiring VSL to which the second driving voltage VSS is supplied, and/or a third driving voltage wiring VIL to which the third driving voltage VINT is supplied.

A pixel circuit PXC may include a driving transistor DT, switch elements, and/or a capacitor CST1. The switch elements may include first through sixth transistors ST1 through ST6.

The driving transistor DT may include a gate electrode, a first electrode, and/or a second electrode. The driving transistor DT may control a drain-source current Ids (hereinafter, referred to as a "driving current") flowing between the first electrode and the second electrode according to a data voltage applied to the gate electrode. The driving current Ids flowing through a channel of the driving transistor DT is proportional to the square of a difference between a voltage Vgs between the first electrode and the gate electrode of the driving transistor DT and a threshold voltage as shown in Equation 1.

$$Ids=k'\times(Vsg-Vth)^2 \qquad (1),$$

where k' is a proportional coefficient determined by the structure and physical characteristics of a driving transistor, Vsg is a voltage between a first electrode and a gate electrode of the driving transistor, and Vth is a threshold voltage of the driving transistor.

A light emitting element ED emits light according to the driving current Ids. The amount of light emitted from the light emitting element ED may increase as the driving current Ids increases.

In an embodiment, the light emitting element ED may be an organic light emitting diode including an organic light emitting layer disposed between an anode and a cathode. In another embodiment, the light emitting element ED may be an inorganic light emitting element including an inorganic semiconductor disposed between an anode and a cathode. In another embodiment, the light emitting element ED may be a quantum dot light emitting element including a quantum dot light emitting layer disposed between an anode and a cathode. In still yet another embodiment, the light emitting element ED may be a micro-light emitting element including a micro-light emitting diode disposed between an anode and a cathode. An embodiment where the light emitting element ED is an organic light emitting diode including an organic light emitting layer disposed between an anode and a cathode will be mainly described below.

In the specification, the 'anode' of the light emitting element ED may be interchangeably referred to as a 'pixel electrode', and the 'cathode' of the light emitting element ED may be interchangeably referred to as a 'common electrode CE'.

The anode of the light emitting element ED may be connected to a first electrode of the fourth transistor ST4 and a second electrode of the sixth transistor ST6, and/or the cathode of the light emitting element ED may be connected to the second driving voltage wiring VSL. A parasitic capacitance Cel may be formed between the anode and the cathode of the light emitting element ED.

The first transistor ST1 may be turned on by an initialization scan signal of the $k^{th}$ display initialization wiring GILk to connect the gate electrode of the driving transistor DT to the third driving voltage wiring VIL. Accordingly, the third driving voltage VINT of the third driving voltage wiring VIL may be applied to the gate electrode of the driving transistor DT. The first transistor ST1 may have a gate electrode connected to the $k^{th}$ display initialization wiring GILk, a first electrode connected to the gate electrode of the driving transistor DT, and a second electrode connected to the third driving voltage wiring VIL.

The second transistor ST2 may be turned on by a display write signal of the $k^{th}$ display write wiring GWLk to connect the first electrode of the driving transistor DT to a $j^{th}$ data wiring Dj. Accordingly, a data voltage of the $j^{th}$ data wiring Dj may be applied to the first electrode of the driving transistor DT. The second transistor ST2 may have a gate electrode connected to the $k^{th}$ display write wiring GWLk, a first electrode connected to the first electrode of the driving transistor DT, and a second electrode connected to the $j^{th}$ data wiring Dj.

The third transistor ST3 may be turned on by the display write signal of the $k^{th}$ display write wiring GWLk to connect the gate electrode and the second electrode of the driving transistor DT. When the gate electrode and the second electrode of the driving transistor DT are connected, the driving transistor DT may operate a diode. The third transistor ST3 may have a gate electrode connected to the $k^{th}$ display write wiring GWLk, a first electrode connected to the second electrode of the driving transistor DT, and a second electrode connected to the gate electrode of the driving transistor DT.

The fourth transistor ST4 may be turned on by a display control signal of the $k^{th}$ display control wiring GCLk to connect the anode of the light emitting element ED to the third driving voltage wiring VIL. The third driving voltage VINT of the third driving voltage wiring VIL may be applied to the anode of the light emitting element ED. The fourth transistor ST4 may have a gate electrode connected to the $k^{th}$ display control wiring GCLk, the first electrode connected to the anode of the light emitting element ED, and a second electrode connected to the third driving voltage wiring VIL.

The fifth transistor ST5 may be turned on by an emission signal of a $k^{th}$ emission wiring ELk to connect the first electrode of the driving transistor DT to the first driving voltage wiring VDL. The fifth transistor ST5 may have a gate electrode connected to the $k^{th}$ emission wiring ELk, a first electrode connected to the first driving voltage wiring VDL, and a second electrode connected to the first electrode of the driving transistor DT.

The sixth transistor ST6 may be disposed between the second electrode of the driving transistor DT and the anode of the light emitting element ED. The sixth transistor ST6 may be turned on by the emission control signal of the $k^{th}$ emission wiring ELk to connect the second electrode of the driving transistor DT to the anode of the light emitting element ED. The sixth transistor ST6 has a gate electrode connected to the $k^{th}$ emission wiring ELk, a first electrode connected to the second electrode of the driving transistor DT, and the second electrode connected to the anode of the light emitting element ED.

When both the fifth transistor ST5 and the sixth transistor ST6 are turned on, the driving current Ids of the driving transistor DT according to the data voltage applied to the gate electrode of the driving transistor DT may flow to the light emitting element ED.

The capacitor CST1 may be formed between the gate electrode of the driving transistor DT and the first driving voltage wiring VDL. The capacitor CST1 may have a first capacitor electrode connected to the gate electrode of the driving transistor DT and a second capacitor electrode connected to the first driving voltage wiring VDL.

When the first electrode of each of the first through sixth transistors ST1 through ST6, respectively, and the driving transistor DT is a source electrode, the second electrode may be a drain electrode. Alternatively, when the first electrode of each of the first through sixth transistors ST1 through ST6, respectively, and the driving transistor DT is a drain electrode, the second electrode may be a source electrode. The terms "source electrode" and "drain electrode" may be changed according to the movement direction of a plurality of carriers of a semiconductor layer. The first and second electrodes of the first through sixth transistors ST1 through ST6, respectively, and the driving transistor DT may be referred to as source/drain electrodes. When the first electrode and the second electrode need to be distinguished from each other, they may be referred to as a first source/drain electrode and a second source/drain electrode.

An active layer of each of the first through sixth transistors ST1 through ST6, respectively, and the driving transistor DT may be made of any one of polysilicon, amorphous silicon, and/or an oxide semiconductor. Although the first through sixth transistors ST1 through ST6, respectively, and the driving transistor DT are mainly described as P-type metal oxide semiconductor field effect transistors (MOSFETs) in FIG. 3, the disclosure is not limited thereto. For example, the first through sixth transistors ST1 through ST6, respectively, and the driving transistor DT may also be formed as N-type MOSFETs. Alternatively, at least one of the first through sixth transistors ST1 through ST6, respectively, may be formed as an N-type MOSFET.

In the above embodiment, an embodiment where the pixel circuit PXC adopts a 7T1C structure including seven transistors and one capacitor has been described. However, the number of transistors and capacitors constituting the pixel circuit PXC may be variously modified.

Figure 4:
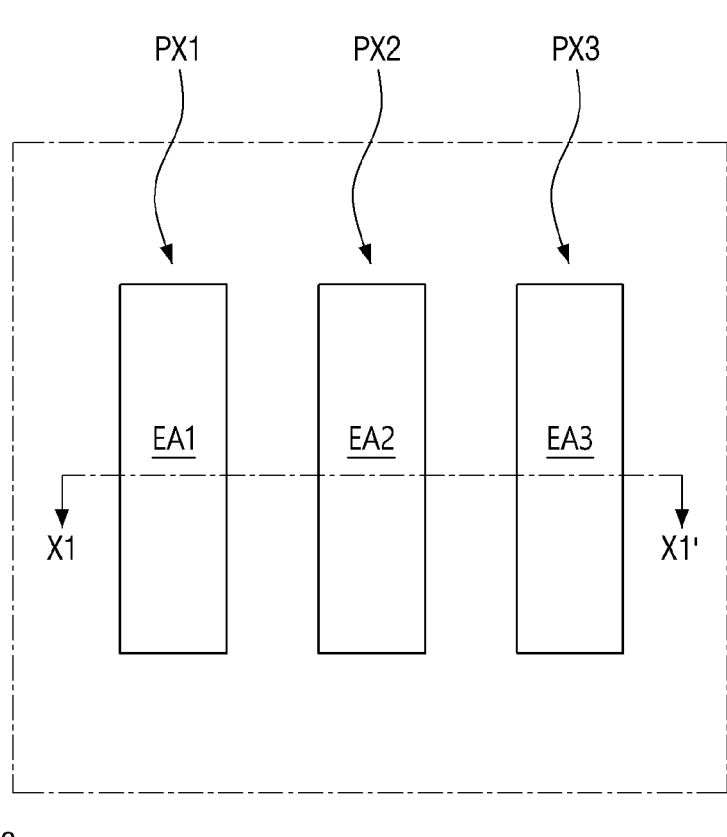
FIG. 4 is a plan view illustrating the pixel arrangement structure of the display device according to an embodiment.
Figure 4:
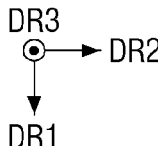

FIG. 4 is a plan view illustrating the pixel arrangement structure of the display device 1 according to the embodiment.

Referring to FIG. 4, a plurality of pixels PX may be arranged in a group. In an embodiment, for example, the pixels PX may be arranged as a group of three pixels. In FIG. 4, the pixels PX may include a first pixel PX1, a second pixel PX2 and a third pixel PX3, and the first pixel PX1, the second pixel PX2 and the second pixel PX3 may form one group. However, the number of pixels PX constituting one group is not limited thereto.

Each of the first pixel PX1, the second pixel PX2, and the third pixel PX3 may have a rectangular, square, and/or rhombic planar shape. In some embodiments, each of the first pixel PX1, the second pixel PX2, and/or the third pixel PX3 may have a rectangular planar shape having long sides in the first direction DR1 and short sides in the second direction DR2 as illustrated in FIG. 4. However, the disclosure is not limited thereto. In an embodiment, for example, each of the first pixel PX1, the second pixel PX2, and the third pixel PX3 may also have a square or rhombic planar shape including sides having the same length in the first direction DR1 and the second direction DR2.

In some embodiments, the first pixel PX1, the second pixel PX2, and/or the third pixel PX3 may be arranged in the second direction DR2 as illustrated in FIG. 4. However, the disclosure is not limited thereto. In an embodiment, for example, the first pixel PX1 and/or any one of the second pixel PX2 and the third pixel PX3 may be arranged in the second direction DR2, and the first pixel PX1 and the other one of the second pixel PX2 and the third pixel PX3 may be arranged in the first direction DR1.

The first pixel PX1 may include a first emission area EA1 emitting a first light, the second pixel PX2 may include a second emission area EA2 emitting a second light, and the third pixel PX3 may include a third emission area EA3 emitting a third light. In this case, the first light may be light in a red wavelength band, the second light may be light in a green wavelength band, and/or the third light may be light in a blue wavelength band. The red wavelength band may be a wavelength band of about 600 to 750 nm, the green wavelength band may be a wavelength band of about 480 to 560 nm, and the blue wavelength band may be a wavelength band of about 370 to 460 nm, but embodiments of the specification are not limited thereto.

As illustrated in FIG. 4, the area of the first pixel PX1, the area of the second pixel PX2, and/or the area of the third pixel PX3 may be substantially the same. However, the disclosure is not limited thereto. In an embodiment, for example, the area of the first pixel PX1, the area of the second pixel PX2, and/or the area of the third pixel PX3 may be different from each other.

Figure 5:
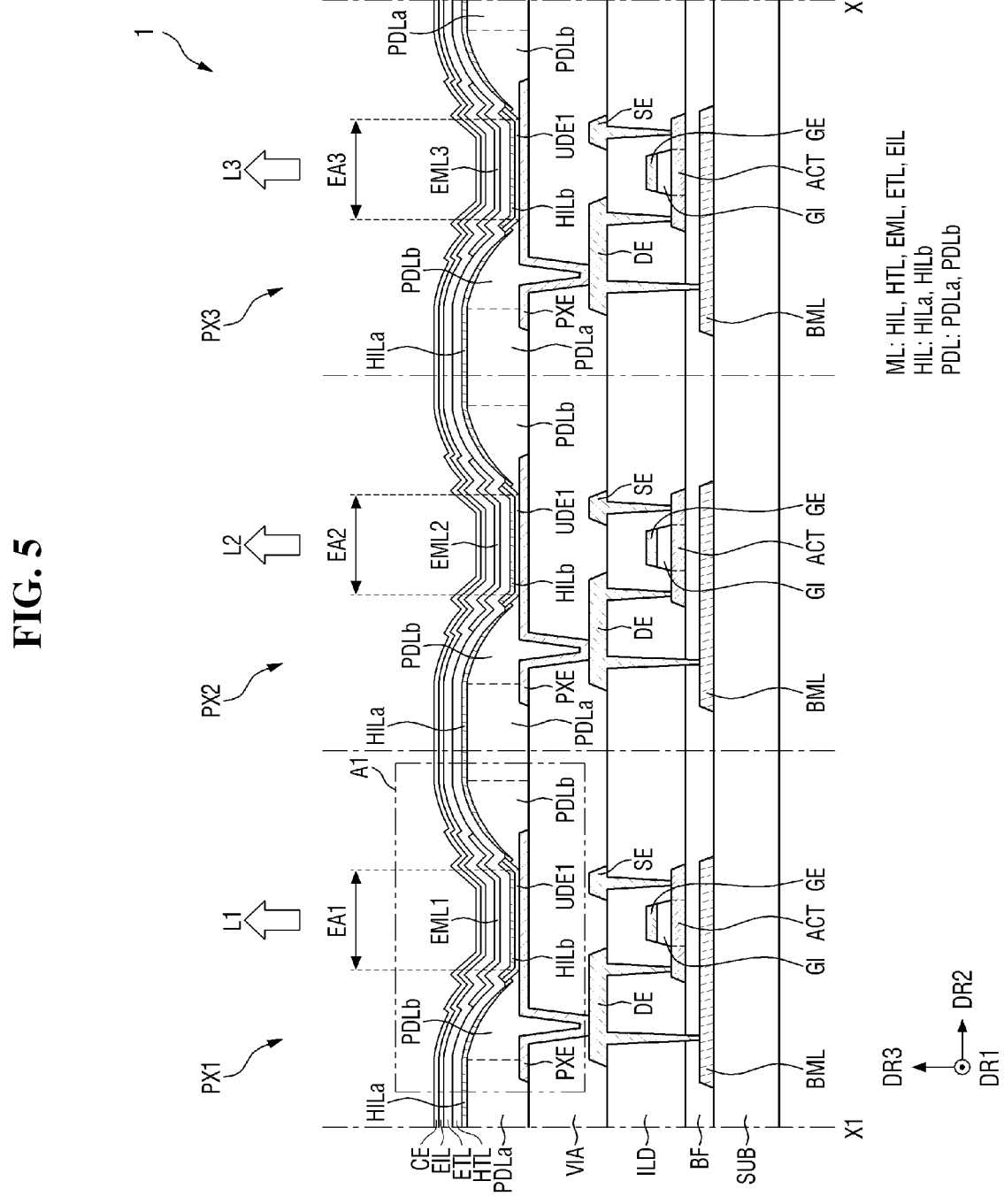
FIG. 5 is a schematic cross-sectional view taken along line X1-X1' of FIG. 4 according to an embodiment.

FIG. 5 is a schematic cross-sectional view taken along line X1-X1' of FIG. 4.

In FIG. 5, the structure of adjacent pixels PX, that is, the first pixel PX1 emitting first light L1, the second pixel PX2 emitting second light L2, and the third pixel PX3 emitting third light L3 is illustrated.

In addition, in FIG. 5, the shape and connection relationship of one thin-film transistor among a plurality of thin-film transistors described with reference to FIG. 3 are illustrated for ease of description. The illustrated thin-film transistor may correspond to, for example, the driving transistor DT of FIG. 3. However, the illustrated connection relationship of the thin-film transistor may only be a possible connection relationship of the thin-film transistor illustrated for convenience, and a specific connection relationship of the thin-film transistor may not exactly match that of the driving transistor DT illustrated in FIG. 3. In an embodiment, except for the connection relationship of the thin-film transistor, other transistors of FIG. 3 may also have substantially the same stacked structure as the thin-film transistor illustrated in FIG. 5.

The structure of the pixels PX of the display device 1 according to an embodiment will be described with reference to FIG. 5.

A substrate SUB may be an insulating substrate or a semiconductor substrate. The substrate SUB may be a rigid substrate. In an embodiment, for example, the substrate SUB may include glass.

In an embodiment, bottom metal layers BML may be disposed on the substrate SUB. The bottom metal layers BML may have a patterned shape and may overlap semiconductor layers ACT thereon to function as light-blocking metal layers that prevent light coming from below the bottom metal layers BML from entering the semiconductor layers ACT. The bottom metal layers BML may be electrically connected to electrodes, e.g., drain electrodes DE of thin-film transistors. The bottom metal layers BML may also be omitted.

A buffer layer BF may be disposed on the bottom metal layers BML. The buffer layer BF may be formed over the entire surface of the substrate SUB. The buffer layer BF may serve to insulate the semiconductor layers ACT from the bottom metal layers BML. The buffer layer BF may include silicon nitride, silicon oxide, and/or silicon oxynitride.

The semiconductor layers ACT may be disposed on the buffer layer BF. As described above, the semiconductor layers ACT may overlap the bottom metal layers BML thereunder in the third direction DR3 which is in the thickness direction. Each of the semiconductor layers ACT may include a first region, a second region, and a channel region disposed between the first region and the second region. The first region may be a source region, and the second region may be a drain region, and vice versa.

The semiconductor layers ACT may include polycrystalline silicon. In an embodiment, the semiconductor layers ACT may include monocrystalline silicon, low-temperature polycrystalline silicon, amorphous silicon, and/or an oxide semiconductor. In an embodiment, for example, the oxide semiconductor may include a binary compound (ABx), a ternary compound (ABxCy) and/or a quaternary compound (ABxCyDz) containing one or more of indium, zinc, gallium, tin, titanium, aluminum, hafnium (Hf), zirconium (Zr), magnesium (Mg), etc. In an embodiment, the semiconductor layers ACT may include ITZO (an oxide including indium, tin, and zinc or IGZO (an oxide including indium, gallium, and zinc).

A gate insulating layer GI may be disposed on each of the semiconductor layers ACT. The gate insulating layer GI may include a silicon compound, a metal oxide, and/or the like. For example, the gate insulating layer GI may include one or more of silicon oxide, silicon nitride, silicon oxynitride, aluminum oxide, tantalum oxide, hafnium oxide, zirconium oxide, titanium oxide, and/or the like. These materials may be used alone or in combination with each other. The gate insulating layer GI may be a single layer or a multilayer including stacked layers of different materials.

The gate insulating layer GI may be disposed on a region of each of the semiconductor layers ACT. In an embodiment, for example, as illustrated in the drawing, the gate insulating layer GI may be disposed on the channel region of each of the semiconductor layers ACT but may expose the first region and the second region. That is, the gate insulating layer GI may overlap the channel region but may not overlap the first region and the second region. The gate insulating layer GI may have substantially the same planar shape as a gate electrode GE thereon.

In another embodiment, the gate insulating layer GI may be disposed on the entire surface of the substrate SUB. In this embodiment, the gate insulating layer GI may generally cover the first region and the second region of each of the semiconductor layers ACT but may include contact holes exposing the first region and the second region so that a source electrode SE and a drain electrode DE can contact each of the semiconductor layers ACT.

A gate conductive layer may be disposed on the gate insulating layer GI. The gate conductive layer may include the gate electrodes GE of the thin-film transistors. In addition, the gate conductive layer may include scan wirings connected to the gate electrodes GE. In an embodiment, for example, the display write wirings GWL, the display initialization wirings GIL, the display control wirings GCL, and/or the emission wirings EL illustrated in FIG. 2 may be made of the gate conductive layer.

The gate electrodes GE may at least partially overlap the channel regions of the semiconductor layers ACT. Accordingly, a gate electrode GE and a semiconductor layer ACT may form a portion of each thin-film transistor.

The gate conductive layer may include at least one selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu). In an embodiment, the gate conductive layer may be a stacked layer of Mo/MoN.

An interlayer insulating layer ILD may be disposed on the gate conductive layer. The interlayer insulating layer ILD may include at least one of an inorganic layer including an inorganic insulating material, an organic layer including an organic insulating material, and/or an organic/inorganic composite layer including an inorganic insulating material and an organic insulating material.

Examples of the inorganic insulating material may include silicon oxide, silicon nitride, silicon oxynitride, hafnium oxide, aluminum oxide, titanium oxide, tantalum oxide, and/or zinc oxide. Examples of the organic insulating material may include polyacrylates resin, epoxy resin, phenolic resin, polyamides resin, polyimides resin, unsaturated polyesters resin, polyphenylenethers resin, polyphenylenesulfides resin, and/or benzocyclobutene (BCB).

The interlayer insulating layer ILD may have a structure in which two or more layers may be selected from a plurality of inorganic layers, a plurality of organic layers, and/or a plurality of organic/inorganic composite layers are stacked. In the drawing, one embodiment of an example in which one inorganic layer is applied as the interlayer insulating layer ILD is illustrated.

A data conductive layer may be disposed on the interlayer insulating layer ILD. The data conductive layer may include the source electrodes SE and/or the drain electrodes DE of the thin-film transistors. The data conductive layer may further include the data wirings DTL illustrated in FIG. 2 and/or the first driving voltage wiring VDL. In addition, the data conductive layer may further include the second driving voltage wiring VSL and/or the third driving voltage wiring VIL.

The source electrode SE and/or the drain electrode DE of each of the thin-film transistors may be electrically connected to the first region and/or the second region of a semiconductor layer ACT through contact holes penetrating the interlayer insulating layer ILD. In addition, the drain electrode DE of each of the thin-film transistors may be electrically connected to a bottom metal layer BML through a contact hole penetrating the interlayer insulating layer ILD and/or the buffer layer BF.

The data conductive layer may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu).

The data conductive layer may be a multilayer. In an embodiment, the data conductive layer may include a main conductive layer and may further include sub-conductive layers disposed under and/or on the main conductive layer. In an embodiment, for example, the data conductive layer may include a first sub-conductive layer, a main conductive layer disposed on the first sub-conductive layer, and/or a second sub-conductive layer disposed on the main conductive layer. The first sub-conductive layer may be a lower sub-conductive layer disposed on a bottom surface of the main conductive layer, and the second sub-conductive layer may be an upper sub-conductive layer disposed on a top surface of the main conductive layer.

Although not illustrated, another conductive layer may be further disposed between the bottom metal layers BML and the data conductive layer.

In an embodiment, when the illustrated gate conductive layer is referred to as a first gate conductive layer, a second gate conductive layer may be used as an electrode of a capacitor and may be further disposed between the first gate conductive layer and the data conductive layer. In addition, when the display panel PNL includes heterogeneous transistors such as a polysilicon transistor and/or an oxide semiconductor transistor, a third gate conductive layer may be further disposed on or under the first gate conductive layer in addition to the first gate conductive layer used as the gate electrode GE of the polysilicon transistor. Here, the second gate conductive layer and/or the third gate conductive layer may have the same stacked structure as the first gate conductive layer. Other more gate conductive layers may also be interposed.

In addition, in an embodiment when the illustrated data conductive layer is referred to as a first data conductive layer, another data conductive layer for serving as a wiring and/or an electrode that the data conductive layer may be responsible for herein may be disposed between the first data conductive layer and the gate conductive layer. In an embodiment, for example, when a second data conductive layer and/or a third data conductive layer are disposed between the first data conductive layer and the gate conductive layer, the data wirings DTL, the source electrodes SE, the drain electrodes DE, the first driving voltage wiring VDL, the second driving voltage wiring VSL, and/or the third driving voltage wiring VIL may be made of any one of the first data conductive layer, the second data conductive layer, and/or the third data conductive layer. Other more data conductive layers may also be disposed.

A via insulating layer VIA (and/or an organic insulating layer) may be disposed on the data conductive layer. The via insulating layer VIA may have a flat upper surface. The via insulating layer VIA may cover the entire surface of the interlayer insulating layer ILD on which the data conductive layer is disposed.

The via insulating layer VIA may include an organic insulating material such as polyacrylates resin, epoxy resin, phenolic resin, polyamides resin, polyimides resin, unsaturated polyesters resin, polyphenylenethers resin, polyphenylenesulfides resin, and/or benzocyclobutene (BCB).

A pixel electrode layer including pixel electrodes may be disposed on the via insulation layer VIA. One pixel electrode may be disposed in each pixel, and the pixel electrodes may be spaced apart from each other. In an embodiment, for example, the pixel electrode layer may include a pixel electrode PXE of the first pixel PX1, a pixel electrode PXE of the second pixel PX2, and/or a pixel electrode PXE of the third pixel PX3.

Each pixel electrode PXE may be electrically connected to the drain electrode DE of a thin-film transistor through a contact hole (or via hole) penetrating the via insulating layer VIA. Each pixel electrode PXE may serve as an anode of a light emitting element.

In some embodiments, the pixel electrode layer may have, but is not limited to, a stacked structure, wherein the stacked structure may include a material layer having a high work function such as indium tin oxide (ITO), indium zinc oxide (IZO), zinc oxide (ZnO) and/or indium oxide ($In_2O_3$), and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) and/or a mixture thereof are stacked. In an embodiment, the material layer having a high work function may be disposed on the reflective material layer so that it is located close to an intermediate layer ML to be described later.

A pixel defining layer PDL may be disposed on the pixel electrode layer. The pixel defining layer PDL may define emission areas. The pixel defining layer PDL may include a flat area PDLa having a generally flat profile and/or an inclined area PDLb forming an inclined surface.

The flat area PDLa of the pixel defining layer PDL may be disposed between the pixels PX1 through PX3 to connect the inclined areas PDLb.

The inclined area PDLb of the pixel defining layer PDL may be disposed on both sides of the flat area PDLa to form an opening as an emission area of each of the pixels PX1 through PX3.

In an embodiment, for example, the inclined area PDLb of the pixel defining layer PDL may define the first emission area EA1 as an opening that at least partially exposes the pixel electrode PXE of the first pixel PX1, define the second emission area EA2 as an opening that at least partially exposes the pixel electrode PXE of the second pixel PX2, and/or define the third emission area EA3 as an opening that at least partially exposes the pixel electrode PXE of the third pixel PX3.

The inclined area PDLb of the pixel defining layer PDL may form an undercut shape with a first auxiliary electrode UDE1 to be described later, so that a hole injection layer HIL of the intermediate layer ML may be deposited with poor step coverage. This will be described in detail later.

The pixel defining layer PDL may include an organic insulating material such as polyacrylates resin, epoxy resin, phenolic resin, polyamides resin, polyimides resin, unsaturated polyesters resin, polyphenylenethers resin, polyphenylenesulfides resin, and/or benzocyclobutene (BCB). The pixel defining layer PDL may also include an inorganic material. In addition, the pixel defining layer PDL may include a stacked layer of an inorganic layer and an organic layer.

The first auxiliary electrode UDE1 may be disposed on a portion of each of the respective pixel electrodes PXE of the pixels PX1 through PX3 that may be exposed by the emission areas EA1 through EA3, respectively, defined by the pixel defining layer PDL.

The first auxiliary electrode UDE1 may cover a portion of each pixel electrode PXE exposed by the pixel defining layer PDL and/or at least a portion of the inclined area PDLb of the pixel defining layer PDL. Accordingly, the first auxiliary electrode UDE1 may have a flat profile in a portion overlapping a portion of each pixel electrode PXE exposed by the pixel defining layer PDL and may have an inclined profile in a portion overlapping the inclined area PDLb of the pixel defining layer PDL.

The first auxiliary electrode UDE1 may be spaced apart from a portion of the inclined area PDLb of the pixel defining layer PDL to form an undercut shape. This will be described in detail later.

In some embodiments, the first auxiliary electrode UDE1 may include, but is not limited to, transparent conductive oxide (TCO), aluminum (Al), and/or copper (Cu).

The intermediate layer ML may be disposed on the pixel defining layer PDL and the first auxiliary electrode UDE1 disposed in each of the pixels PX1 through PX3. The intermediate layer ML may include the hole injection layer HIL, a hole transport layer HTL, a light-emitting layer EML, an electron transport layer ETL, and/or an electron injection layer EIL stacked sequentially.

In this case, holes may move from each pixel electrode PXE, which is an anode, to the light-emitting layer EML through the hole injection layer HIL and the hole transport layer HTL, and electrons may move from a common electrode CE, which is a cathode, to the light-emitting layer EML through the electron injection layer EIL and the electron transport layer ETL. Then, the holes and electrons that were moved to the light-emitting layer EML may combine together to form excitons, and the excitons may emit light as they are excited to an unstable energy state and then return to a stable state.

In an embodiment, some of the element layers constituting the intermediate layer ML of the display device 1 may generally integrally extend to cover each opening of the pixel defining layer PDL. In an embodiment, for example, each of the hole transport layer HTL, the electron injection layer EIL, and/or the electron transport layer ETL of the intermediate layer ML may integrally extend to cover not only an upper surface of the pixel defining layer PDL but also the inclined area PDLb of the pixel defining layer PDL which may form the first emission area EA1, the second emission area EA2 and/or the third emission area EA3 defined by the pixel defining layer PDL.

The wavelength of light emitted from the light-emitting layer EML varies according to the type of organic material included in the light-emitting layer EML. Therefore, in some embodiments, the light-emitting layer EML may be separated for each of the pixels PX1 through PX3, respectively, so that the pixels PX1 through PX3, respectively, may emit light of different wavelengths.

The hole injection layer HIL may be formed on the entire surface of the pixels PX1 through PX3, but may be separated for each of the pixels PX1 through PX3 by an undercut shape formed by the first auxiliary electrode UDE1 in each of the pixels PX1 through PX3 and the inclined area PDLb of the pixel defining layer PDL.

In the above-described light emission method, in order for the pixels PX1 through PX3 to be driven independently, a driving voltage may be independently applied to each of the pixels PX1 through PX3. In an embodiment, if the hole injection layer HIL, which may have relatively high conductivity characteristics among the various element layers of the intermediate layer ML, integrally extends to cover each opening of the pixel defining layer PDL, like the hole transport layer HTL, the electron injection layer EIL and/or the electron transport layer ETL, when a driving current is applied to any one of the pixels PX1 through PX3, the driving current may also be applied to another pixel through the hole injection layer HIL and thus may serve as a leakage current thereby affecting driving of the another pixel. Therefore, it may be necessary to separate the hole injection layer HIL having the relatively high conductivity characteristics for each of the pixels PX1 through PX3, respectively.

In some embodiments, the hole injection layer HIL may include a material having high conductivity characteristics such as, but not limited to, 2-(7-Dicyanomethylene-1,3,4,5, 6,8,9,10-octafluoro-7H-pyren-2-ylidene)-malononitrile (NDP-9).

A structure in which the hole injection layer HIL is separated by an undercut shape formed by the first auxiliary electrode UDE1 and the inclined area PDLb of the pixel defining layer PDL will be described in detail later.

The common electrode CE may be disposed on the intermediate layer ML. The common electrode CE may integrally extend to cover each opening of the pixel defining layer PDL. In other words, the common electrode CE may generally cover the intermediate layer ML. In an embodiment, for example, the common electrode CE may cover the entire display area DA of the display panel PNL in the plan view.

In some embodiments, the common electrode CE may include, but is not limited to, a material layer having a small work function such as Li, Ca, LiF/Ca, LiF/Al, Al, Mg, Ag, Pt, Pd, Ni, Au Nd, Ir, Cr, BaF, Ba, and/or a compound and/or mixture thereof (e.g., a mixture of Ag and Mg). The common electrode layer CEL may further include a transparent metal oxide layer disposed on the material layer having a small work function.

The undercut shape formed by the first auxiliary electrode UDE1 and the inclined area PDLb of the pixel defining layer PDL and the shape of the hole injection layer HIL separated by the undercut shape will now be described in more detail.

Figure 6:
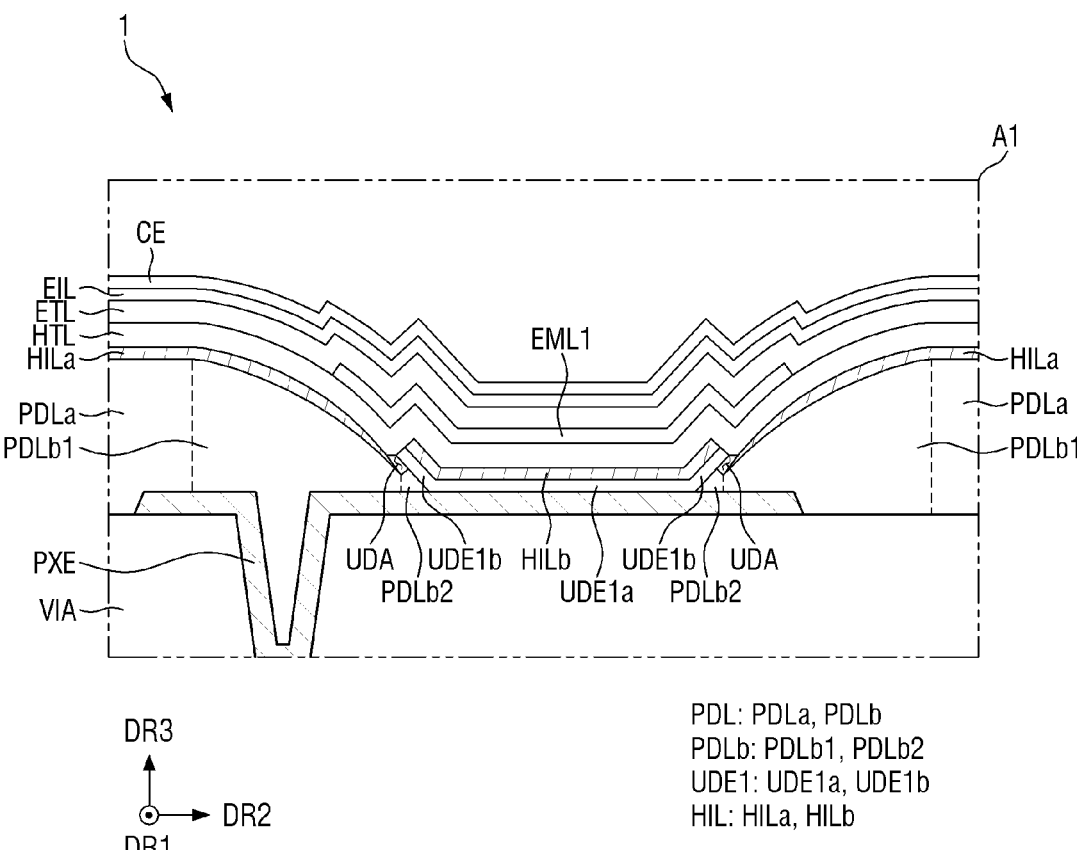
FIG. 6 is an enlarged view of area A1 of FIG. 5 according to an embodiment.

FIG. 6 is an enlarged view of area A1 of FIG. 5.

FIG. 6 illustrates the structure of the pixel defining layer PDL, the first auxiliary electrode UDE1, the intermediate layer ML and the common electrode CE disposed on the pixel electrode PXE of the first pixel PX1.

As described above, the first auxiliary electrodes UDE1 respectively disposed on the pixel electrodes PXE of the display device 1 according to the embodiment may have the same structure. Therefore, for ease of description, the structure of the first auxiliary electrode UDE1 disposed on the pixel electrode PXE of the first pixel PX1 will be mainly described below, and the structure of the second pixel PX2 and the third pixel PX3 will not be described.

Referring to FIG. 6 in connection with FIG. 5, the inclined area PDLb of the pixel defining layer PDL may include a first inclined area PDLb1 and/or a second inclined area PDLb2.

The first inclined area PDLb1 of the pixel defining layer PDL may be disposed adjacent to the flat area PDLa of the pixel defining layer PDL. The first inclined area PDLb1 of the pixel defining layer PDL may generally slope downward toward the second side in the third direction DR3 along the second direction DR2.

The second inclined area PDLb2 of the pixel defining layer PDL may protrude from the first inclined area PDLb1 toward an opening formed by the pixel defining layer PDL.

The second inclined area PDLb2 may slope upward in the third direction DR3 along the second direction DR2 in a portion adjacent to the first inclined area PDLb1 and then slope downward in the third direction DR3 along the second direction DR2.

The first auxiliary electrode UDE1 may include a flat portion UDE1a having a flat profile and an inclined portion UDE1b having an inclined profile in cross section.

The flat portion UDE1a of the first auxiliary electrode UDE1 may be disposed on a portion of the pixel electrode PXE exposed by the pixel defining layer PDL. Since the portion of the pixel electrode PXE exposed by the pixel defining layer PDL has a flat profile on the via insulating layer VIA in cross section, the flat portion UDE1a may also have a flat profile in cross section.

The inclined portion UDE1b of the first auxiliary electrode UDE1 may be disposed on both sides of the flat portion UDE1a. A portion of the inclined portion UDE1b may contact a portion of the second inclined area PDLb2 of the pixel defining layer PDL which slopes downward in the third direction DR3 along the second direction DR2, and the other portion of the inclined portion UDE1b may extend to protrude from the second inclined area PDLb2.

Accordingly, a portion of the second inclined area PDLb2 which slopes up toward the first side in the third direction DR3 may be located further inward than the portion of the inclined portion UDE1b of the first auxiliary electrode UDE1 which protrudes from the second inclined area PDLb2. As a result, an undercut area may be formed. In other words, a portion of the first inclined area PDLb1 of the pixel defining layer PDL, a portion of the second inclined area PDLb2 which slopes upward in the third direction DR3, and a portion of the inclined portion UDE1b of the first auxiliary electrode UDE1 which protrudes from the second inclined area PDLb2 may form an undercut area UDA.

The hole injection layer HIL may include a first portion HILa disposed on the first inclined area PDLb1 of the pixel defining layer PDL and a second portion HILb disposed on the first auxiliary electrode UDE1. The hole injection layer HIL may be separated into the first portion HILa and the second portion HILb by an undercut shape formed by the first auxiliary electrode UDE1 and the inclined area PDLb of the pixel defining layer PDL. The hole injection layer HIL may be deposited with poor step coverage due to the undercut shape formed by the first auxiliary electrode UDE1 and the inclined area PDLb of the pixel defining layer PDL.

The first portion HILa of the hole injection layer HIL may be disposed along the profile of the pixel defining layer PDL. In an embodiment, for example, the first portion HILa may extend with a flat profile along the pixel defining layer PDL and then may bend at least once along the first inclined area PDLb1 of the pixel defining layer PDL. The first portion HILa may not contact the first auxiliary electrode UDE1.

The second portion HILb of the hole injection layer HIL may be separated from the first portion HILa and disposed on the first auxiliary electrode UDE1. In other words, the first portion HILa and the second portion HILb may be physically separated from each other. The second portion HILb of the hole injection layer HIL may have substantially the same profile as the first auxiliary electrode UDE1.

In the above-described configuration, if a driving current is applied to an adjacent pixel, since the hole injection layer HIL is separated for each of the pixels PX1 through PX3, respectively, it may be possible to prevent and/or at least reduce the generation of a leakage current that affects driving of the adjacent pixel. Accordingly, each of the pixels PX1 through PX3 may easily be independently driven.

A method of manufacturing the display device 1 according to the embodiment will now be described.

FIGS. 7 through 10 are views illustrating a process of manufacturing the display device according to the embodiment.

FIGS. 7 through 10 are cross-sectional views respectively illustrating processes of forming the first auxiliary electrode UDE1, the first and second inclined areas PDLb1 and PDLb2 of the pixel defining layer PDL, and the hole injection layer HIL of the display device 1 according to an embodiment.

Figure 7:
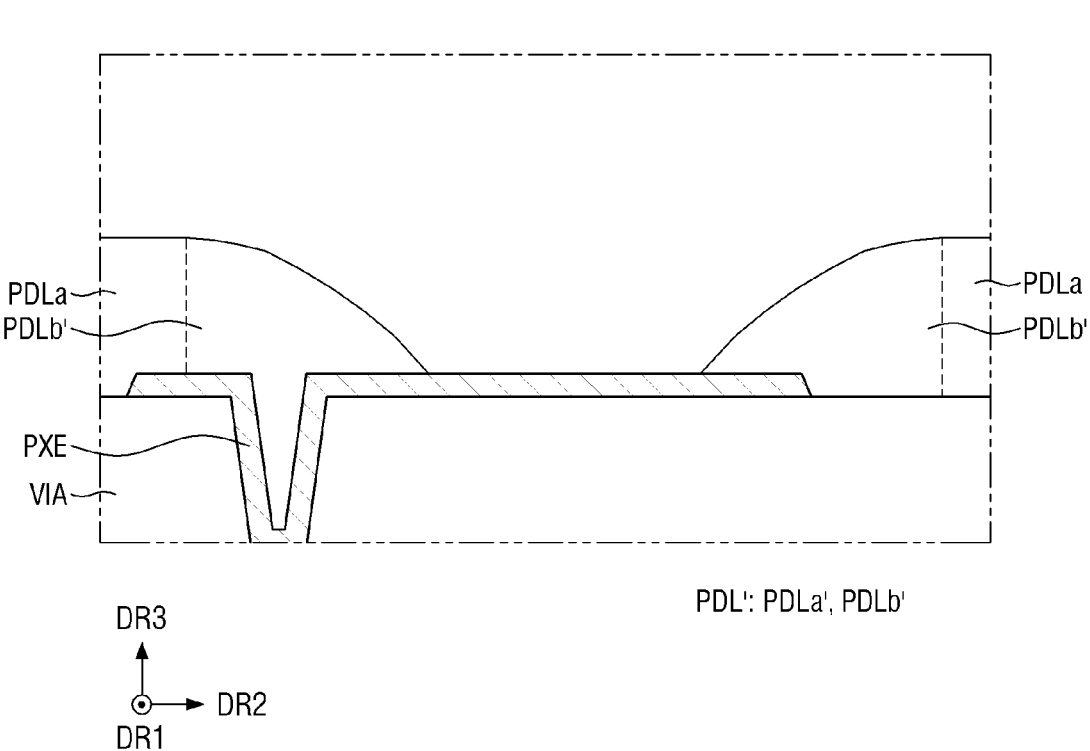
FIG. 7 is a cross-sectional view of a pixel defining layer of a display device according to an embodiment, wherein the first inclined area and the second inclined area are not yet formed.

Referring to FIG. 7, a pixel defining layer PDL' having an opening may be formed on a pixel electrode PXE on the via insulating layer VIA. The pixel defining layer PDL' illustrated in FIG. 7 may refer to a pixel defining layer in which the first inclined area PDLb1 and the second inclined area PDLb2 are not yet formed.

In an embodiment, the pixel defining layer PDL' may include a flat area PDLa and an inclined area PDLb'. The inclined area PDLb' may generally slope downward toward the second side in the third direction DR3 along the second direction DR2. A method of forming the pixel defining layer PDL' is as follows.

An organic material layer for forming the pixel defining layer PDL' may be coated, dried, and baked. The organic material layer may be exposed to light using a photomask including a light transmitting area and a light blocking area, and an exposed portion of the organic material layer may be selectively removed using a developing solution.

Figure 8:
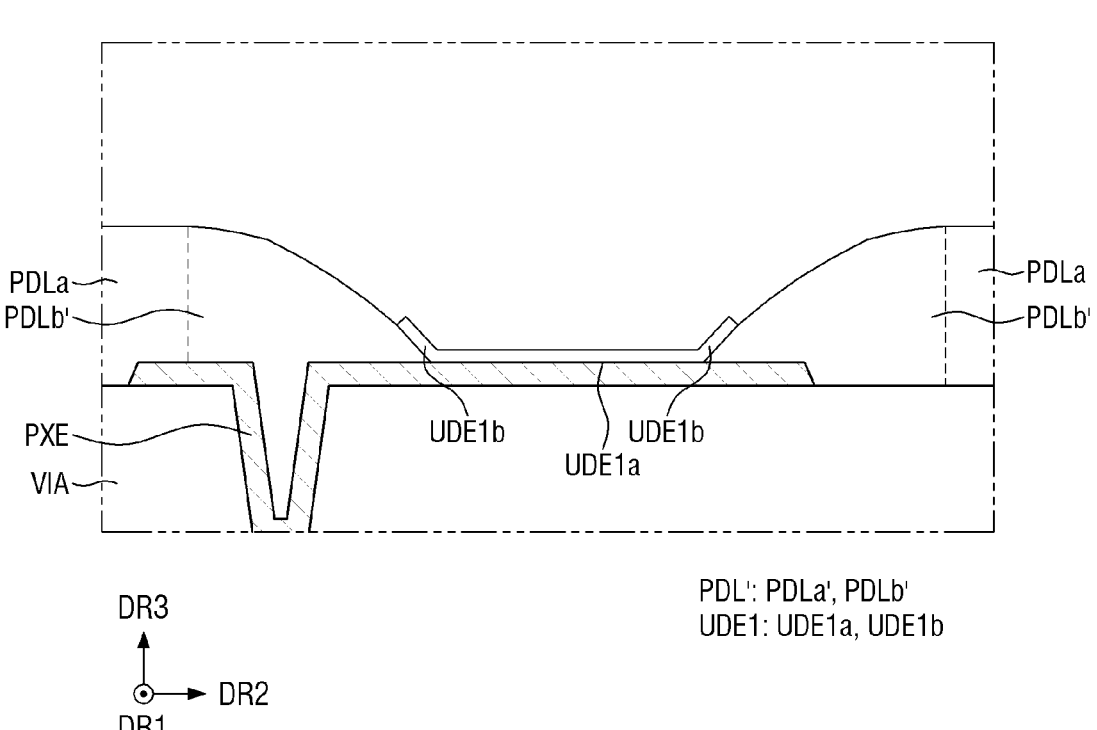
FIG. 8 is a cross-sectional view of a pixel defining layer of a display device according to an embodiment, wherein the pixel defining layer includes a first auxiliary electrode formed thereon.

Referring to FIG. 8, the first auxiliary electrode UDE1 may be formed on the pixel defining layer PDL in which the opening may be formed. A method of forming the first auxiliary electrode UDE1 is described as follows.

A first auxiliary electrode material layer (not illustrated) may be formed to cover the pixel defining layer PDL and the opening formed in the pixel defining layer PDL, and a photoresist pattern (not illustrated) may be formed on a portion of the first auxiliary electrode material layer which corresponds to the opening formed by the pixel defining layer PDL. The first auxiliary electrode UDE1 may be formed by etching the first auxiliary electrode material layer using the photoresist pattern as an etch stop layer.

In an embodiment, the inclined portion UDE1b of the first auxiliary electrode UDE1 may be disposed on the inclined area PDLb' of the pixel defining layer PDL'.

Figure 9A:
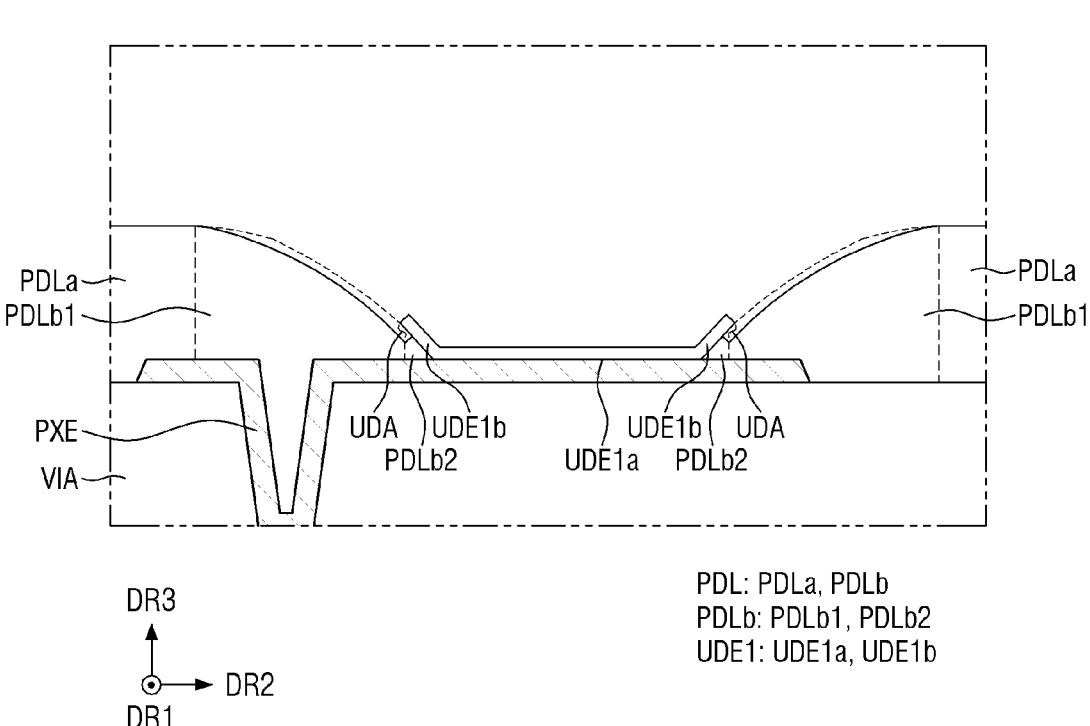
FIG. 9A is a cross-sectional view of a pixel defining layer of a display device according to an embodiment, wherein the pixel defining layer includes a first inclined area and a second inclined area formed thereon.

Referring to FIGS. 8 and 9A, the first inclined area PDLb1 and the second inclined area PDLb2 may be formed by etching a portion of the inclined area PDLb' of the pixel defining layer PDL' which is not covered by the inclined portion UDE1b of the first auxiliary electrode UDE1.

In an embodiment, the process of forming the first inclined area PDLb1 and the second inclined area PDLb2 may be performed by, for example, dry etching.

In an embodiment, for example, a portion of the inclined area PDLb' of the pixel defining layer PDL' which is not covered by the inclined portion UDE1b of the first auxiliary electrode UDE1 may be dry-etched by using the inclined portion UDE1b of the first auxiliary electrode UDE1 as an etch stop layer or by forming a photoresist pattern (not illustrated) on the inclined portion UDE1b and using the photoresist pattern as an etch stop layer. In this case, not only the portion of the inclined area PDLb' of the pixel defining layer PDL' which may not be covered by the inclined portion UDE1b of the first auxiliary electrode UDE1, but also a portion of the pixel defining layer PDL' which may be disposed under the inclined portion UDE1b of the first auxiliary electrode UDE1 may be etched.

Accordingly, a portion of the first inclined area PDLb1 of the pixel defining layer PDL, a portion of the second inclined area PDLb2 which slopes upward toward the first side in the third direction DR3, and a portion of the inclined portion UDE1b of the first auxiliary electrode UDE1 which protrudes from the second inclined area PDLb2 may form the undercut area UDA.

As illustrated in FIG. 9A, in an embodiment, the undercut area UDA may be formed by etching only upper surfaces of the first inclined area PDLb1 and the second inclined area PDLb2 excluding the flat area PDLa. In this case, an etch stop layer for preventing etching may be formed on an upper surface of the flat area PDLa.

Figure 9B:
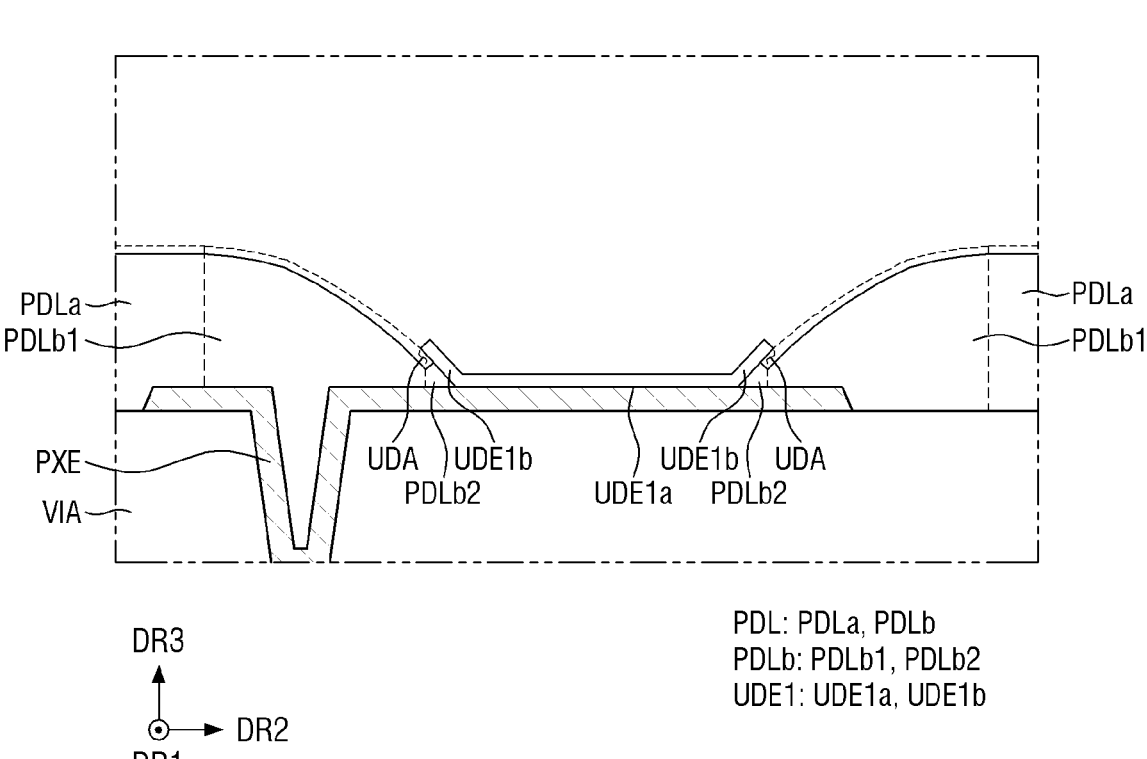
FIG. 9B is a cross-sectional view of a pixel defining layer of a display device according to an embodiment, wherein the pixel defining layer includes an undercut area.

In another embodiment, as illustrated in FIG. 9B, the undercut area UDA may be formed by etching the upper surfaces of the flat area PDLa, the first inclined area PDLb1, and the second inclined area PDLb2 together. In this case, there may be no need to form an etch stop layer on the upper surface of the flat area PDLa to prevent etching.

Figure 10:
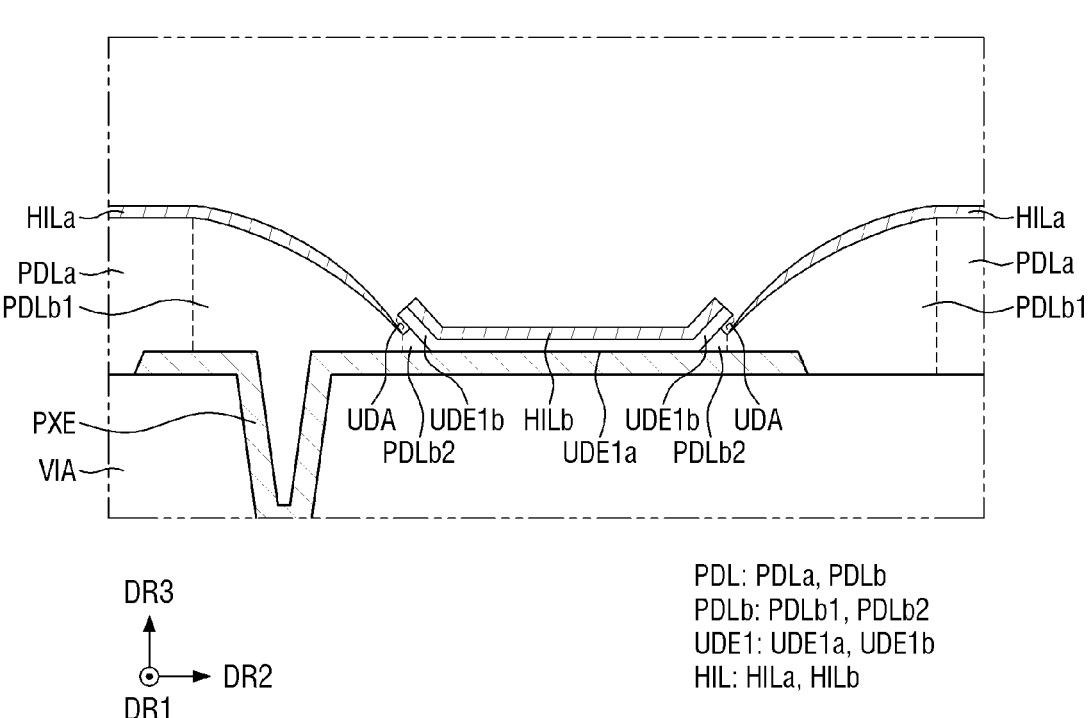
FIG. 10 is a cross-sectional view of a pixel defining layer of a display device according to an embodiment, wherein the pixel defining layer includes a hole injection layer deposited thereon.

Referring to FIG. 10, the hole injection layer HIL may be deposited. The hole injection layer HIL may be deposited with poor step coverage due to the undercut shape formed by the first auxiliary electrode UDE1 and the inclined area PDLb of the pixel defining layer PDL.

Accordingly, the hole injection layer HIL may include a first portion HILa disposed on the first inclined area PDLb1 of the pixel defining layer PDL and a second portion HILb disposed on the first auxiliary electrode UDE1. In an embodiment, the hole injection layer HIL may be separated into the first portion HILa and the second portion HILb by the undercut shape formed by the first auxiliary electrode UDE1 and the inclined area PDLb of the pixel defining layer PDL.

Other embodiments of the display device 1 will now be described. In the following embodiments, the same elements as those of the above-described embodiment will be indicated by the same reference numerals, and their redundant description will be omitted or given briefly, and differences may be mainly described.

Figure 11:
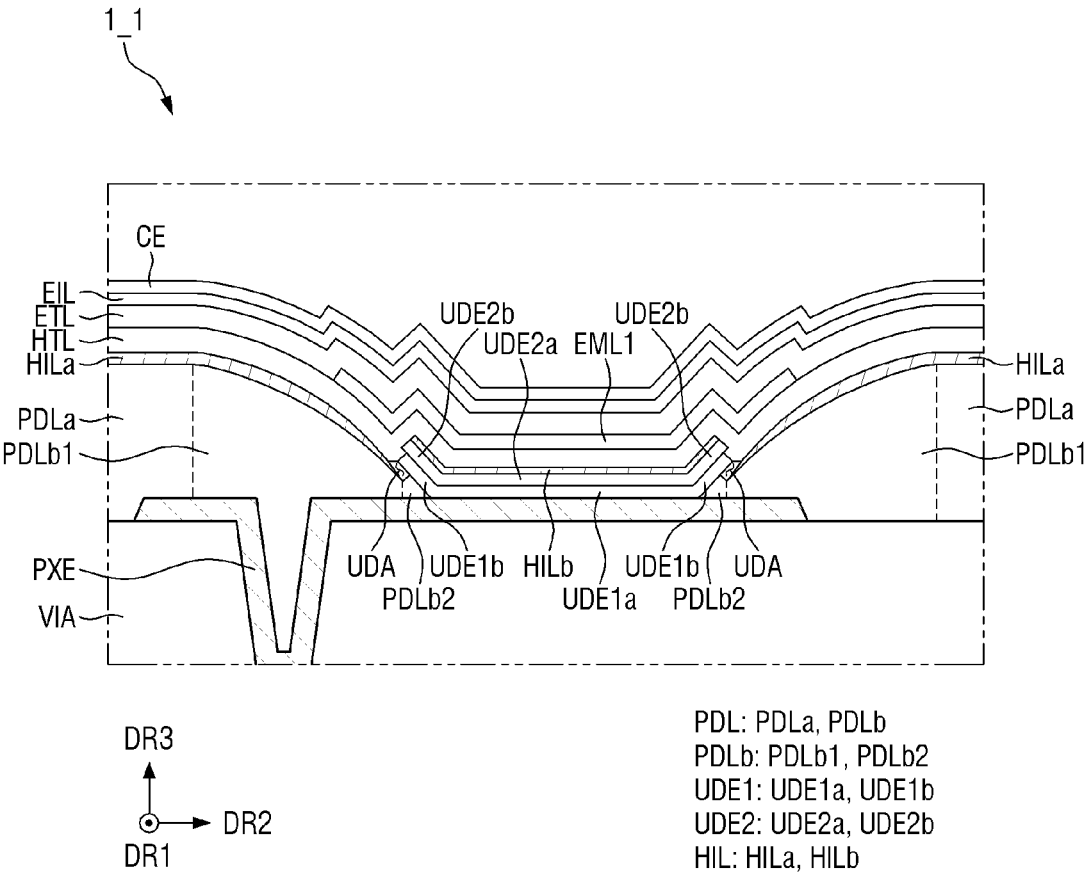
FIG. 11 is a cross-sectional view illustrating the pixel structure of a display device according to an embodiment.

FIG. 11 is a cross-sectional view illustrating the pixel structure of a display device 1_1 according to an embodiment.

Referring to FIG. 11, the display device 1_1 according to an embodiment, may further include a second auxiliary electrode UDE2 disposed between a first auxiliary electrode UDE1 and a second portion HILb of a hole injection layer HIL.

The second auxiliary electrode UDE2 may have substantially the same profile as the first auxiliary electrode UDE1. In an embodiment, for example, the second auxiliary electrode UDE2 may include a flat portion UDE2a disposed on a flat portion UDE1a of the first auxiliary electrode UDE1 and an inclined portion UDE2b disposed on an inclined portion UDE1b of the first auxiliary electrode UDE1.

In the above-described configuration, since a first portion HILa and the second portion HILb of the hole injection layer HIL are spaced apart from each other, the hole injection layer HIL may be easily deposited with poor step coverage.

In some embodiments, the inclined portion UDE2b of the second auxiliary electrode UDE2 may protrude from the inclined portion UDE1b of the first auxiliary electrode UDE1, but the disclosure is not limited thereto. In this case, the hole injection layer HIL may be more easily deposited with poor step coverage.

Figure 12:
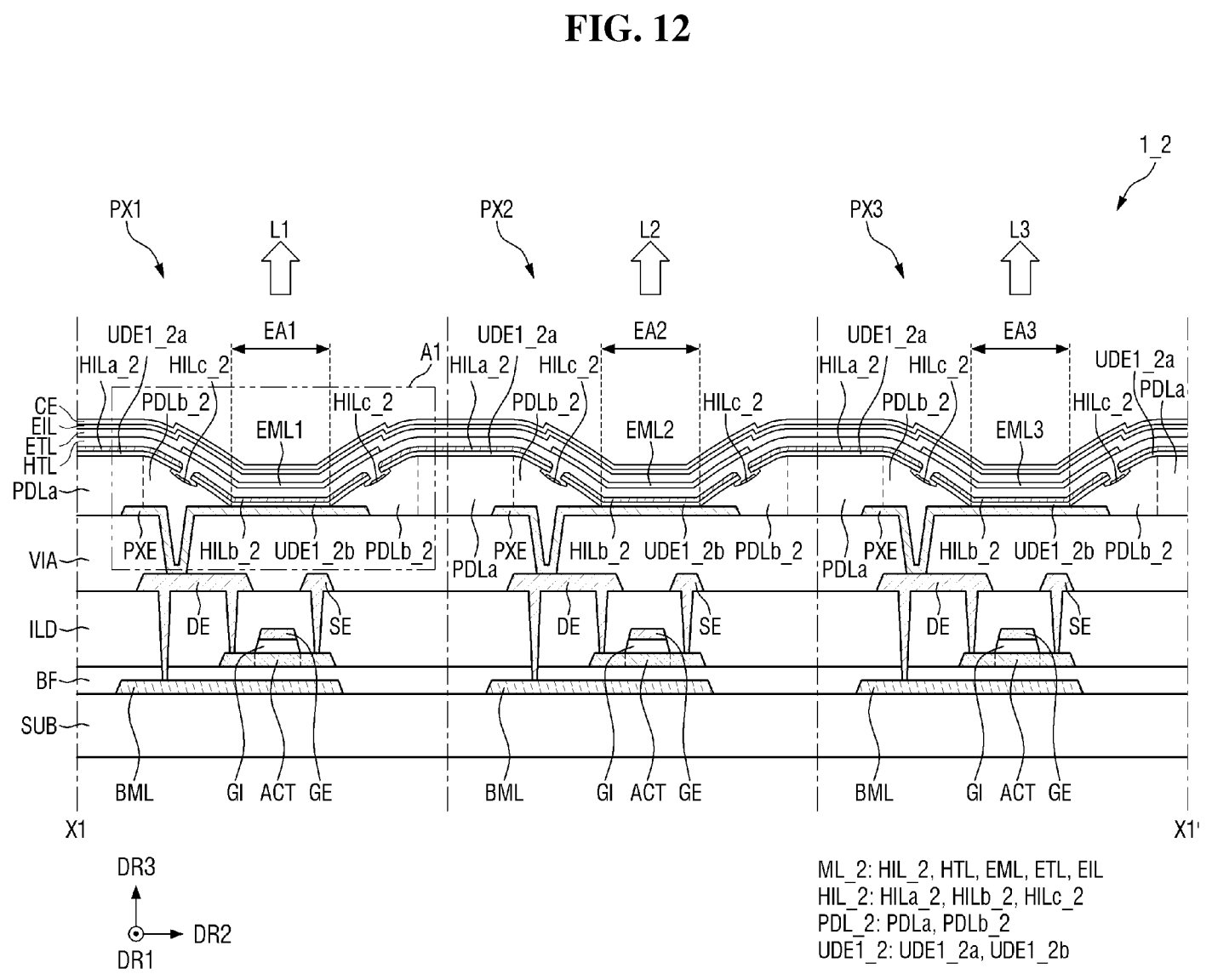
Figure 13:
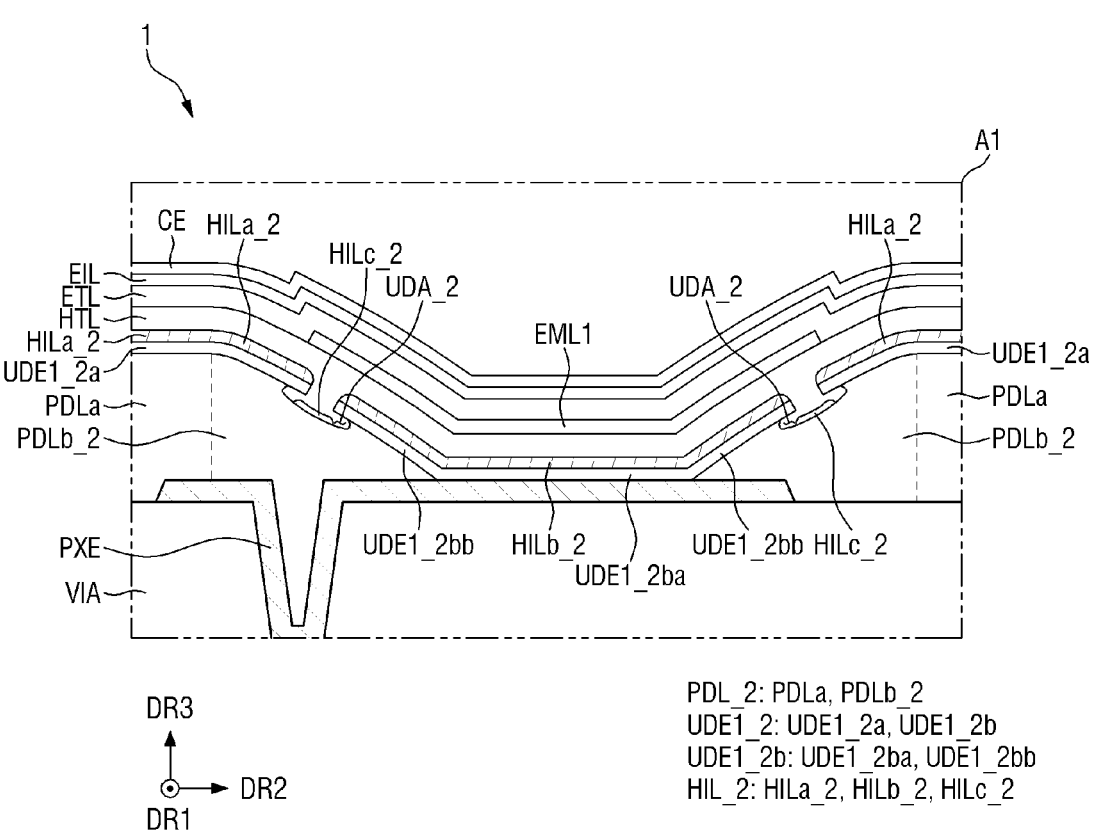
FIG. 13 is an enlarged view of area A1 of FIG. 12.

FIG. 12 is a cross-sectional view illustrating the schematic cross-sectional structure of a display device 1_2 according to an embodiment. FIG. 13 is an enlarged view of area A1 of FIG. 12.

Referring to FIGS. 12 and 13, in the display device 1_2 according to an embodiment, a recessed portion UDA_2 recessed into a pixel defining layer PDL_2 and a first auxiliary electrode UDE1_2 may form an undercut shape to separate a hole injection layer HIL_2.

The recessed portion UDA_2 recessed into the pixel defining layer PDL_2 may be formed in the pixel defining layer PDL_2. In some embodiments, the recessed portion UDA_2 may have an oval shape in cross section, but the disclosure is not limited thereto.

In some embodiments, the recessed portion UDA_2 may be formed in an inclined area PDLb_2 of the pixel defining layer PDL_2, but the disclosure is not limited thereto. In an embodiment, for example, the recessed portion UDA_2 may also be formed in a flat area PDLa of the pixel defining layer PDL_2. In FIGS. 12 and 13, the recessed portion UDA_2 may be formed in the inclined area PDLb_2 of the pixel defining layer PDL_2.

In addition, although one recessed portion UDA_2 is formed in FIGS. 12 and 13, the number of recessed portions UDA_2 is not limited.

The first auxiliary electrode UDE1_2 may be disposed on the pixel defining layer PDL_2 and a pixel electrode PXE.

The first auxiliary electrode UDE1_2 may include a first undercut forming portion UDE1_2a which may be disposed on a second side of the recessed portion UDA_2 in the second direction DR2 and may cover the flat area PDLa of the pixel defining layer PDL_2 and a portion of the inclined area PDLb_2 of the pixel defining layer PDL_2 and a second undercut forming portion UDE1_2b which may be disposed on a first side of the recessed portion UDA_2 in the second direction DR2 and may cover the inclined area PDLb_2 of the pixel defining layer PDL_2 and a portion of the pixel electrode PXE exposed by an opening formed by the pixel defining layer PDL_2.

The first auxiliary electrode UDE1_2 may be separated by the recessed portion UDA_2 of the pixel defining layer PDL_2. In an embodiment, for example, the first undercut forming portion UDE1_2a and the second undercut forming portion UDE1_2b may be spaced apart from each other, and a space between the first undercut forming portion UDE1_2a and the second undercut forming portion UDE1_2b may expose the recessed portion UDA_2.

In addition, a distance between the first undercut forming portion UDE1_2a and the second undercut forming portion UDE1_2b may be smaller than a width of the recessed portion UDA_2. Accordingly, a portion of the first undercut forming portion UDE1_2a may protrude from the second side of the recessed portion UDA_2 in the second direction DR2, and a portion of the second undercut forming portion UDE1_2b may protrude from the first side of the recessed portion UDA_2 in the second direction DR2, thereby forming an undercut shape.

The first undercut forming portion UDE1_2a may include a portion having a generally flat profile along the flat area PDLa of the pixel defining layer PDL_2 and a portion having a generally inclined profile along the inclined area PDLb_2 of the pixel defining layer PDL_2. A portion of the first undercut forming portion UDE1_2a which protrudes from the second side of the recessed portion UDA_2 in the second direction DR2 may be a portion of the portion having the inclined profile.

The second undercut forming portion UDE1_2b may include a flat portion UDE1_2ba having a generally flat profile along a portion of the pixel electrode PXE exposed by an opening formed by the pixel defining layer PDL_2 and an inclined portion UDE1_2bb having an inclined profile along the inclined area PDLb_2 of the pixel defining layer PDL_2. A portion of the second undercut forming portion UDE1_2b which protrudes from the first side of the recessed portion UDA_2 in the second direction DR2 may be a portion of the inclined portion UDE1_2bb.

The hole injection layer HIL_2 of an intermediate layer ML_2 may be disposed on the first auxiliary electrode UDE1_2. The hole injection layer HIL_2 may be separated into a first portion HILa_2, a second portion HILb_2, and a third portion HILc_2 by an undercut shape formed by the recessed portion UDA_2 and the first auxiliary electrode UDE1_2. In other words, the hole injection layer HIL_2 may be deposited with poor step coverage due to an undercut shape formed by the first auxiliary electrode UDE1_2 and the inclined area PDLb_2 of the pixel defining layer PDL_2.

The first portion HILa_2 of the hole injection layer HIL_2 may be disposed on the first undercut forming portion UDE1_2a of the first auxiliary electrode UDE1_2. The first portion HILa_2 may have substantially the same profile as the first undercut forming portion UDE1_2a.

The second portion HILb_2 of the hole injection layer HIL_2 may be disposed on the second undercut forming portion UDE1_2b of the first auxiliary electrode UDE1_2. The second portion HILb_2 may have substantially the same profile as the second undercut forming portion UDE1_2b.

The third portion HILc_2 of the hole injection layer HIL_2 may be disposed on the recessed portion UDA_2 of the pixel defining layer PDL_2. The third portion HILc_2 may be separated from the first portion HILa_2 and the second portion HILb_2 and may not contact the first undercut forming portion UDE1_2a and the second undercut forming portion UDE1_2b.

In the above-described configuration, even if a driving current is applied to an adjacent pixel, since the hole injection layer HIL is separated for each pixel PX1, PX2 or PX3, respectively, it may be possible to prevent or at least reduce the generation of a leakage current that may affect driving of the adjacent pixel. Accordingly, each of the pixels PX1 through PX3 may easily be independently driven.

A method of manufacturing the display device 1_2 according to the embodiment of FIG. 12 will now be described.

FIGS. 14 through 18 are views illustrating a process of manufacturing the display device 1_2 according to the embodiment of FIG. 12.

FIGS. 14 through 18 are cross-sectional views respectively illustrating processes of forming the first auxiliary electrode UDE1_2, the recessed portion UDA_2 of the pixel defining layer PDL_2, and the hole injection layer HIL_2 of the display device 1_2 according to the embodiment of FIG. 12.

Figure 14:
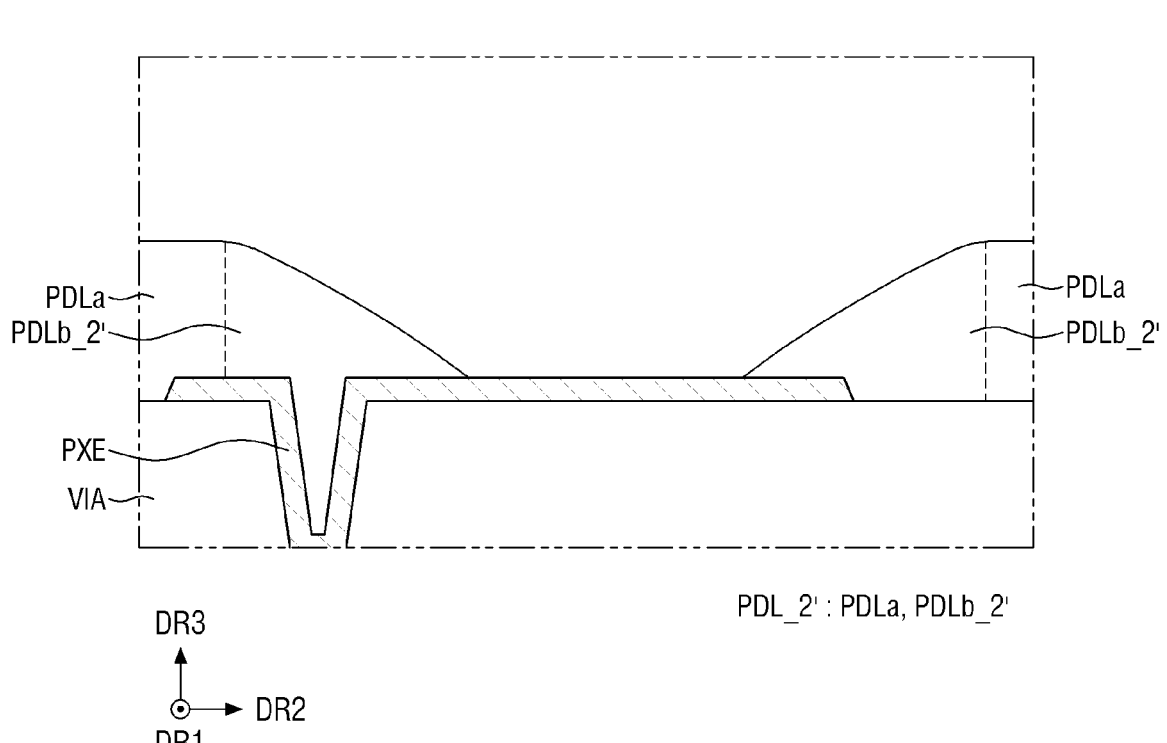
FIG. 14 is a cross-sectional view of a pixel defining layer of a display device according to an embodiment of FIG. 12, wherein the pixel defining layer includes an opening formed on a pixel electrode disposed on a via insulating layer.

Referring to FIG. 14, a pixel defining layer PDL_2' having an opening is formed on a pixel electrode PXE on a via insulating layer VIA. The pixel defining layer PDL_2' illustrated in FIG. 14 may refer to a pixel defining layer in which the recessed portion UDA_2 may not yet be formed.

In this case, the pixel defining layer PDL_2' may include a flat area PDLa and an inclined area PDLb_2'. The inclined area PDLb_2' may generally slope downward toward the second side in the third direction DR3 along the second direction DR2. An embodiment of a method of forming the pixel defining layer PDL_2' is described as follows.

An organic material layer for forming the pixel defining layer PDL_2' may be coated, dried, and baked. The organic material layer may be exposed to light using a photomask including a light transmitting area and a light blocking area, and an exposed portion of the organic material layer may be selectively removed using a developing solution.

Figure 15:
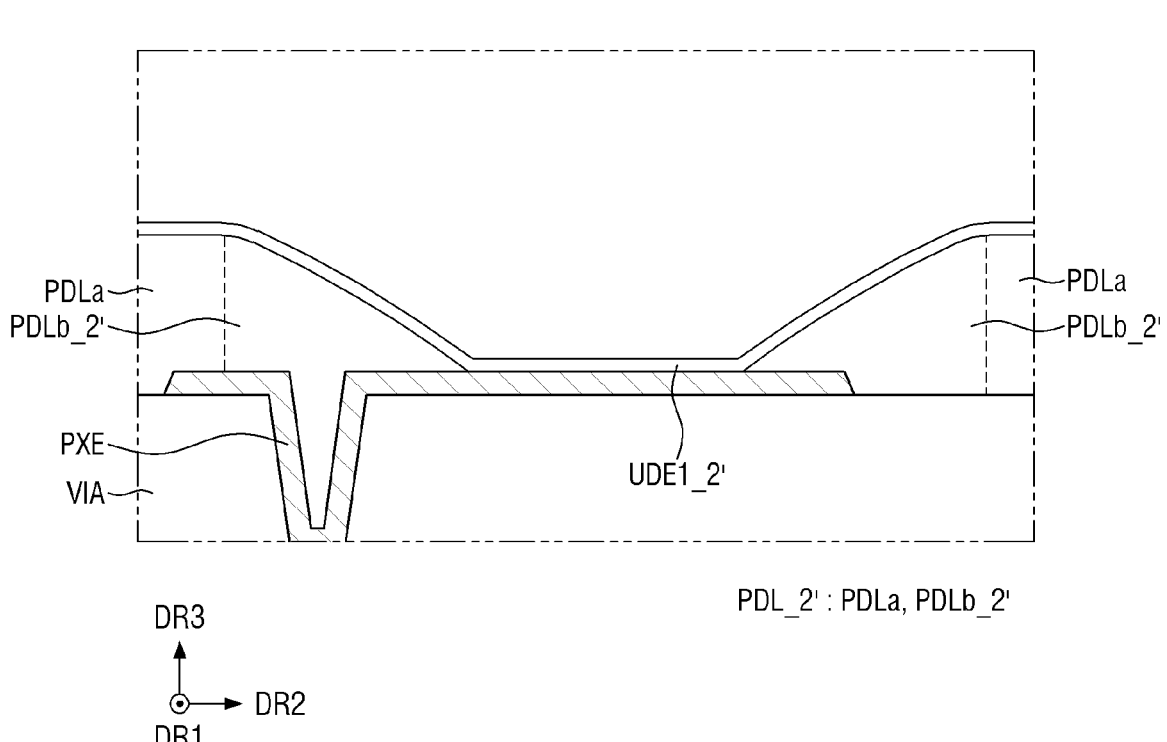
FIG. 15 is a cross-sectional view of a pixel defining layer of a display device according to an embodiment of FIG. 12, wherein the pixel defining layer includes a first auxiliary electrode material layer formed thereon.
Figure 16:
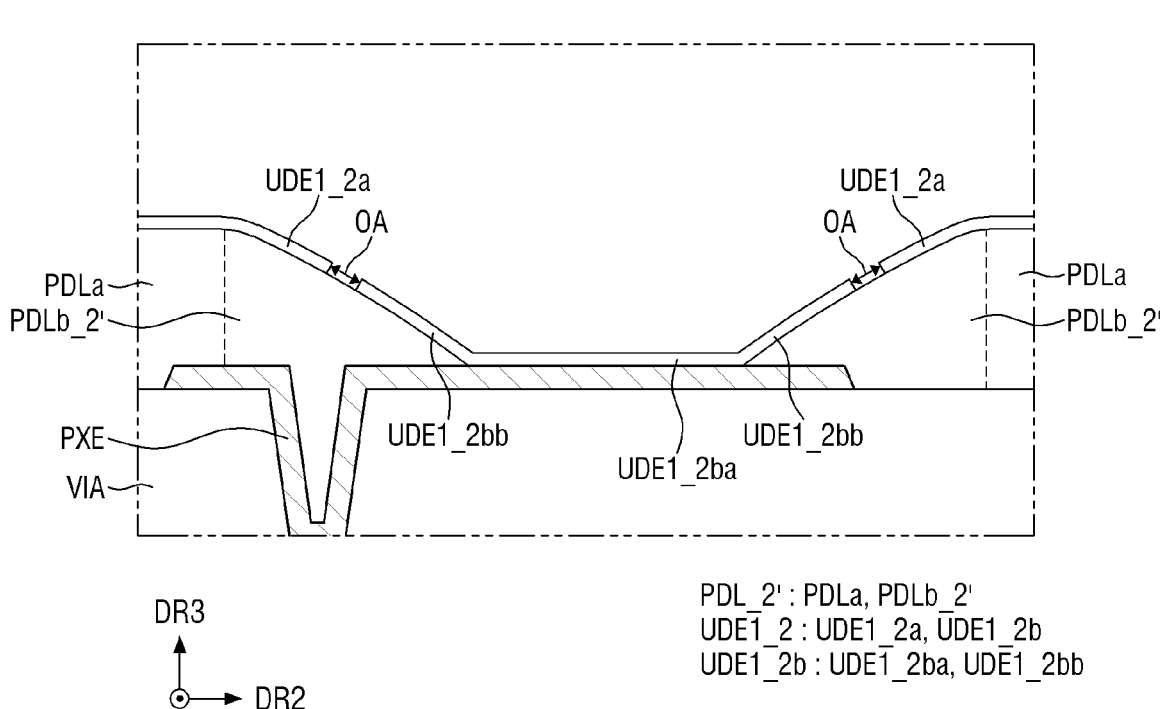
FIG. 16 is a cross-sectional view of a pixel defining layer of a display device according to an embodiment of FIG. 12, wherein the first auxiliary electrode material layer includes an opening formed therein.

Referring to FIGS. 15 and 16, a first auxiliary electrode material layer UDE1_2' may be formed on the pixel defining layer PDL_2' having an opening, and the first auxiliary electrode UDE1_2 may be formed by etching a portion of the first auxiliary electrode material layer UDE1_2'. An embodiment of a method of forming the first auxiliary electrode UDE1_2 is described as follows.

A photoresist pattern (not illustrated) may be formed on a portion of the first auxiliary electrode material layer UDE1_2' which corresponds to the opening formed by the pixel defining layer PDL_2'. The first auxiliary electrode UDE1_2 may be formed by etching the first auxiliary electrode material layer UDE1_2' using the photoresist pattern as an etch stop layer.

In this case, the first auxiliary electrode UDE1_2 may form an opening OA that exposes a portion of the pixel defining layer PDL_2'. For example, the first undercut forming portion UDE1_2*a* and the second undercut forming portion UDE1_2*b* of the first auxiliary electrode UDE1_2 may be spaced apart from each other with the opening OA, which exposes a portion of the pixel defining layer PDL_2', interposed between them.

Figure 17:
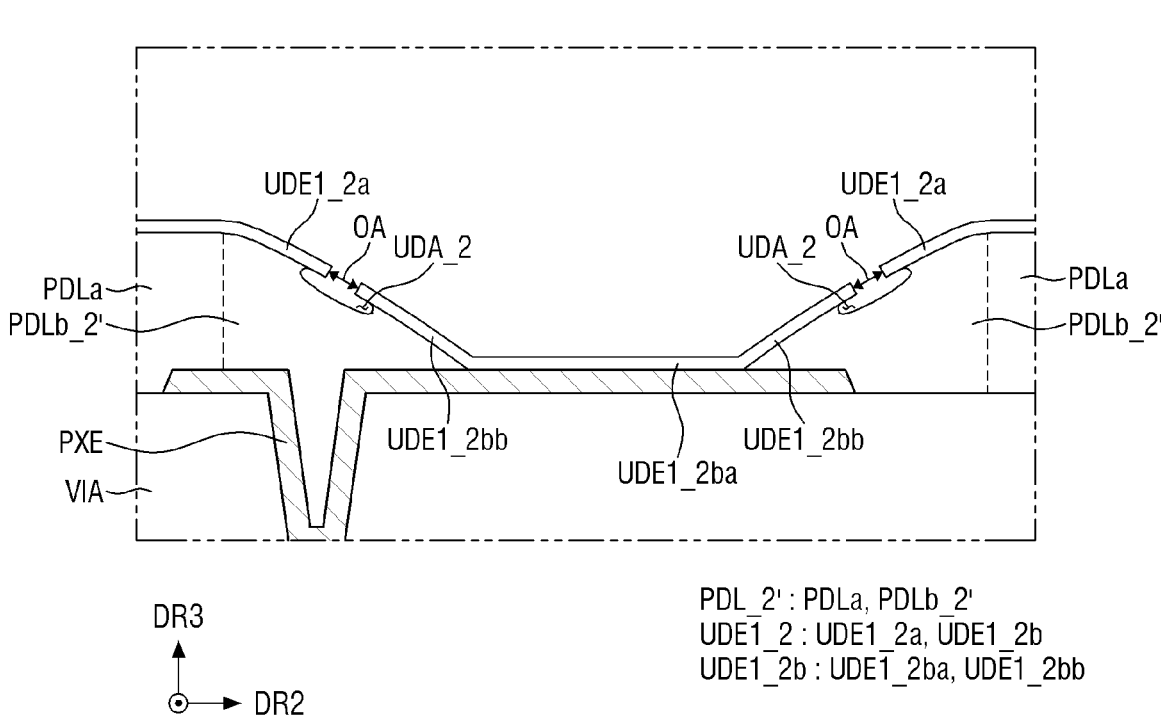
FIG. 17 is a cross-sectional view of a pixel defining layer of a display device according to an embodiment of FIG. 12, wherein the pixel defining layer includes a recessed portion formed thereon.

Referring to FIGS. 16 and 17, the recessed portion UDA_2 may be formed by etching a portion of the pixel defining layer PDL_2' which is exposed by the opening OA formed by the first auxiliary electrode UDE1_2. In embodiment, the process of forming the recessed portion UDA_2 may be performed by, for example, dry etching.

In this case, a portion of the pixel defining layer PDL_2' which is covered by the first undercut forming portion UDE1_2*a* and the second undercut forming portion UDE1_2*b* may also be partially etched. Accordingly, the recessed portion UDA_2 may be formed to be wider than the opening OA between the first undercut forming portion UDE1_2*a* and the second undercut forming portion UDE1_2*a*, thereby forming an undercut shape.

Figure 18:
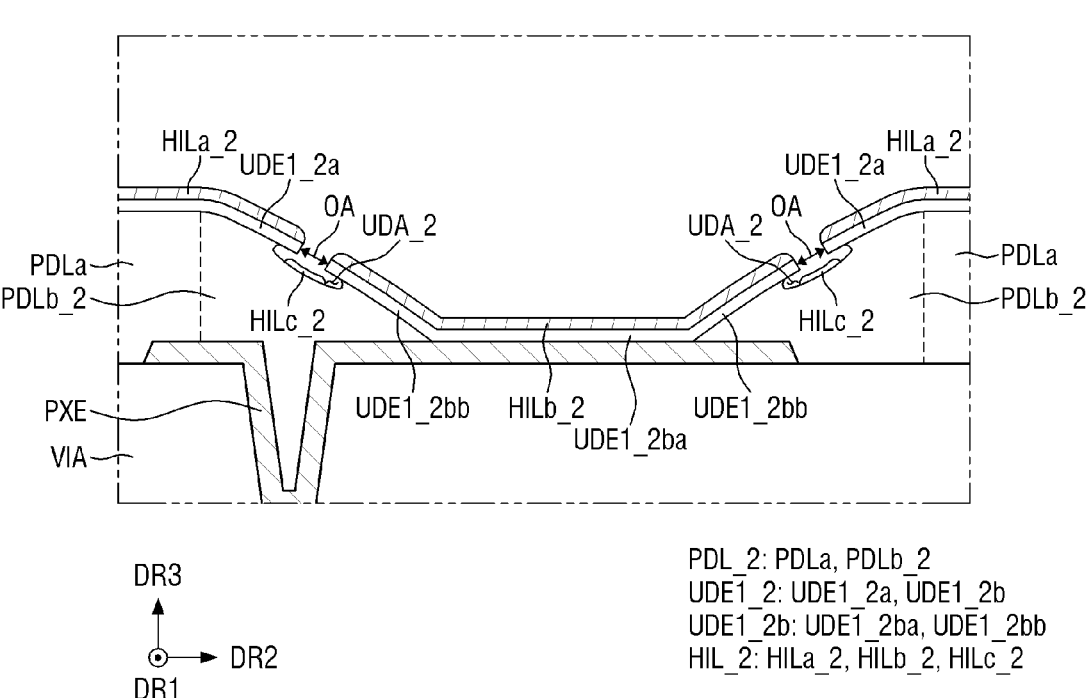
FIG. 18 is a cross-sectional view of a pixel defining layer of a display device according to an embodiment of FIG. 12, wherein the pixel defining layer includes a hole injection layer formed thereon.

Referring to FIG. 18, the hole injection layer HIL_2 may be deposited. The hole injection layer HIL_2 may be deposited with poor step coverage due to the undercut shape formed by the first auxiliary electrode UDE1_2 and the recessed portion UDA_2 of the pixel defining layer PDL_2.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a pixel electrode disposed on a substrate;
a pixel defining layer disposed on the pixel electrode and comprising an inclined surface which forms an opening exposing a portion of the pixel electrode;
a first auxiliary electrode disposed on the pixel defining layer and the pixel electrode;

an intermediate layer disposed on the pixel defining layer and the first auxiliary electrode; and
a common electrode disposed on the intermediate layer,
wherein the first auxiliary electrode comprises a first flat portion in contact with the portion of the pixel electrode and a first inclined portion in contact with at least a portion of the inclined surface,
wherein the inclined surface comprises a first area spaced apart from the first inclined portion and a second area protruding from the first area toward the opening and contacting at least a portion of the first inclined portion,
wherein the intermediate layer comprises a hole injection layer, a light-emitting layer and an electron injection layer stacked sequentially,
wherein the first inclined portion protrudes from the second area and is spaced apart from the first area to form a space therebetween, and
wherein the hole injection layer comprises a first portion disposed on the first area and a second portion separated from the first portion and disposed on the first auxiliary electrode.

2. The display device of claim 1, wherein the intermediate layer further comprises a hole transport layer disposed between the light-emitting layer and the hole injection layer,
wherein the hole transport layer integrally extends to cover the inclined surface and the first auxiliary electrode.

3. The display device of claim 2, wherein the intermediate layer further comprises an electron transport layer disposed between the light-emitting layer and the electron injection layer,
wherein each of the electron transport layer and the electron injection layer integrally extends to cover the inclined surface and the first auxiliary electrode.

4. The display device of claim 3, wherein the first portion is not in contact with the pixel electrode.

5. The display device of claim 4, wherein the hole injection layer comprises NDP-9.

6. The display device of claim 1, wherein the second area is located further inward than the first inclined portion to form an undercut shape.

7. The display device of claim 6, wherein the second portion has a profile corresponding to that of the first auxiliary electrode.

8. The display device of claim 1, further comprising a second auxiliary electrode disposed between the first auxiliary electrode and the intermediate layer,
wherein the second auxiliary electrode comprises a second flat portion disposed on the first flat portion and a second inclined portion disposed on the first inclined portion.

9. The display device of claim 8, wherein the second inclined portion protrudes from the first inclined portion.

10. The display device of claim 9, wherein the second portion is disposed on the second auxiliary electrode.

11. A display device comprising:
a pixel electrode disposed on a substrate;
a pixel defining layer disposed on the pixel electrode and forming an opening which exposes a portion of the pixel electrode;
an auxiliary electrode disposed on the pixel defining layer and the pixel electrode;
an intermediate layer disposed on the pixel defining layer and the auxiliary electrode; and
a common electrode disposed on the intermediate layer,
wherein the pixel defining layer comprises a recessed portion recessed into the pixel defining layer, the auxiliary electrode comprises a first undercut forming portion disposed on a first side of the recessed portion and contacting the portion of the pixel electrode, and the intermediate layer comprises a hole injection layer, a light-emitting layer and an electron injection layer stacked sequentially, wherein the hole injection layer comprises a first portion disposed on the first undercut forming portion and a second portion separated from the first portion and disposed on the recessed portion.

12. The display device of claim 11, wherein the intermediate layer further comprises a hole transport layer disposed between the light-emitting layer and the hole injection layer, wherein the hole transport layer integrally extends to cover an inclined surface of the pixel defining layer and the auxiliary electrode.

13. The display device of claim 12, wherein the intermediate layer further comprises an electron transport layer disposed between the light-emitting layer and the electron injection layer, wherein each of the electron transport layer and the electron injection layer integrally extends to cover the inclined surface of the pixel defining layer and the auxiliary electrode.

14. The display device of claim 13, wherein the second portion does not contact the auxiliary electrode.

15. The display device of claim 14, wherein the hole injection layer comprises NDP-9.

16. The display device of claim 11, wherein the first undercut forming portion protrudes from the first side of the recessed portion to form an undercut shape in which the first side of the recessed portion is located further inward than the first undercut forming portion.

17. The display device of claim 16, wherein the auxiliary electrode further comprises a second undercut forming portion disposed on a second side of the recessed portion and spaced apart from the first undercut forming portion.

18. The display device of claim 17, wherein the second undercut forming portion protrudes from the second side of the recessed portion to form an undercut shape in which the second side of the recessed portion is located further inward than the second undercut forming portion.

19. The display device of claim 18, wherein a space is defined between the first undercut forming portion and the second undercut forming portion to expose the recessed portion.

20. The display device of claim 19, wherein a width of the space is smaller than a width of the recessed portion.

* * * * *